(12) United States Patent
Ueda

(10) Patent No.: US 10,546,761 B2
(45) Date of Patent: Jan. 28, 2020

(54) SUBSTRATE PROCESSING APPARATUS

(71) Applicant: HITACHI KOKUSAI ELECTRIC INC., Tokyo (JP)

(72) Inventor: Tatsushi Ueda, Toyama (JP)

(73) Assignee: KOKUSAI ELECTRIC CORPORATION, Tokyo (JP)

(*) Notice: Subject to any disclaimer, the term of this patent is extended or adjusted under 35 U.S.C. 154(b) by 317 days.

(21) Appl. No.: 15/591,806

(22) Filed: May 10, 2017

(65) Prior Publication Data

US 2017/0243764 A1 Aug. 24, 2017

Related U.S. Application Data

(63) Continuation of application No. 14/674,016, filed on Mar. 31, 2015, now abandoned.

(30) Foreign Application Priority Data

Nov. 28, 2014 (JP) .................................. 2014-241360

(51) Int. Cl.
*H01L 21/67* (2006.01)
*C23C 16/44* (2006.01)
(Continued)

(52) U.S. Cl.
CPC .... *H01L 21/67017* (2013.01); *C23C 16/4405* (2013.01); *C23C 16/4408* (2013.01); *C23C 16/4412* (2013.01); *C23C 16/4584* (2013.01); *C23C 16/45551* (2013.01); *C23C 16/54* (2013.01); *H01L 21/02057* (2013.01); *H01L 21/02186* (2013.01); *H01L 21/67103* (2013.01);
(Continued)

(58) Field of Classification Search
None
See application file for complete search history.

(56) References Cited

U.S. PATENT DOCUMENTS 6,821,563 B2 11/2004 Yudovsky
8,092,598 B2 1/2012 Baek et al.
(Continued)

FOREIGN PATENT DOCUMENTS

JP 2000-355768 A 12/2000
JP 2002-151489 A 5/2002
(Continued)

*Primary Examiner* — Eric W Golightly
(74) *Attorney, Agent, or Firm* — Volpe and Koenig, P.C.

(57) ABSTRACT

There is provided a technique that includes: loading substrates into a process chamber and mounting the substrates on a substrate mounting stand, which is installed in the process chamber, along a circumferential direction; maintaining the substrate mounting stand at a substrate processing position; processing the substrates on the substrate mounting stand, which is maintained at the substrate processing position, by supplying a first gas and a second gas from a first gas supply unit and a second gas supply unit, respectively, arranged above the substrate mounting stand while rotating the substrate mounting stand; unloading the substrates from the process chamber; maintaining the substrate mounting stand at a cleaning position; and cleaning the substrate mounting stand, which is maintained at the cleaning position, by supplying a cleaning gas from a third gas supply unit arranged above the substrate mounting stand, wherein the cleaning position is lower than the substrate processing position.

13 Claims, 18 Drawing Sheets

(51) Int. Cl.
  *H01L 21/687*  (2006.01)
  *C23C 16/458*  (2006.01)
  *C23C 16/54*   (2006.01)
  *C23C 16/455*  (2006.01)
  *H01L 21/02*   (2006.01)

(52) U.S. Cl.
  CPC .. *H01L 21/67248* (2013.01); *H01L 21/68707* (2013.01); *H01L 21/68742* (2013.01); *H01L 21/68764* (2013.01); *H01L 21/68771* (2013.01); *H01L 21/68785* (2013.01)

(56) References Cited

U.S. PATENT DOCUMENTS

| | | |
|---|---|---|
| 2004/0026037 A1 | 2/2004 | Shinriki et al. |
| 2004/0082171 A1 | 4/2004 | Shin et al. |
| 2007/0087579 A1 | 4/2007 | Kitayama et al. |
| 2011/0212625 A1 | 9/2011 | Toyoda et al. |
| 2012/0006265 A1 | 1/2012 | Chin et al. |
| 2012/0222620 A1 | 9/2012 | Yudovsky |
| 2012/0225193 A1 | 9/2012 | Yudovsky |
| 2012/0225195 A1 | 9/2012 | Yudovsky |
| 2013/0210238 A1 | 8/2013 | Yudovsky |
| 2013/0225207 A1 | 8/2013 | Sennett et al. |
| 2014/0030434 A1 | 1/2014 | Strzyzewski et al. |
| 2014/0287594 A1 | 9/2014 | Terasaki et al. |
| 2016/0083837 A1 | 3/2016 | Narushima et al. |

FOREIGN PATENT DOCUMENTS

| | | |
|---|---|---|
| JP | 2011-222960 A | 11/2011 |
| JP | 2013-077627 A | 4/2013 |
| WO | 2014/178160 A | 11/2014 |

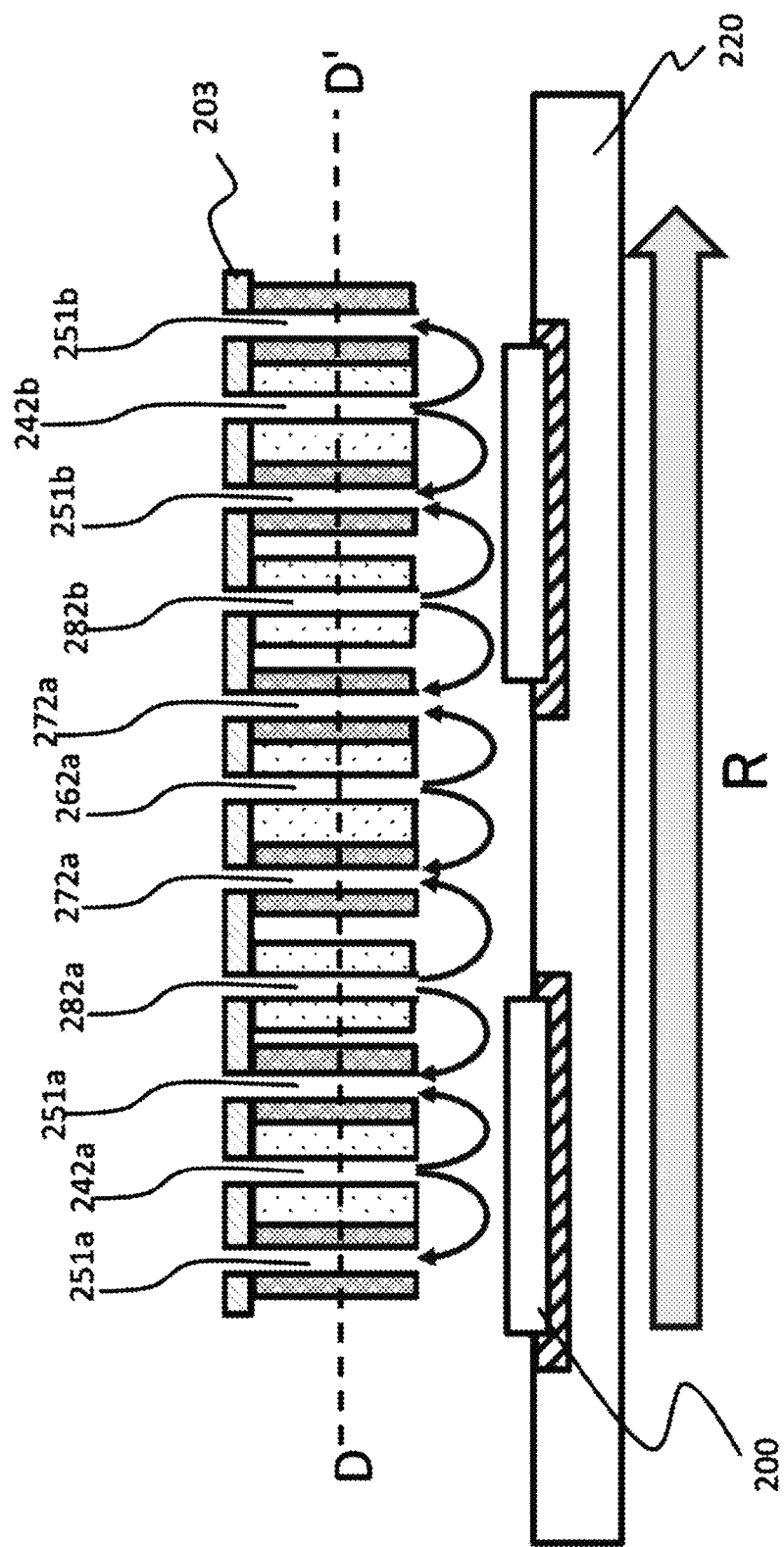

SUBSTRATE PROCESSING APPARATUS

CROSS-REFERENCE TO RELATED APPLICATION

This application is continuation of U.S. patent application Ser. No. 14/671,016, filed Mar. 31, 2015, which is based upon and claims the benefit of priority from Japanese Patent Application No. 2014-241360, filed on Nov. 28, 2014, the entire contents of which are incorporated herein by reference.

TECHNICAL FIELD

The present disclosure relates to a substrate processing apparatus, a semiconductor device manufacturing method, and program.

BACKGROUND

In general, a substrate processing apparatus for performing processes such as a film forming process on a substrate, e.g., a wafer, is used in a semiconductor device manufacturing process. As one example of the processes performed by the substrate processing apparatus, there is available a film forming process using an alternate supply method. In the film forming process using the alternate supply method, a film is formed on a processing target substrate by repeating a predetermined number of cycles (n cycles), each cycle including a precursor gas supply step, a purge step, a reaction gas supply step and a purge step for the processing target substrate. As one example of the substrate processing apparatus for performing the film forming process, there is available a substrate processing apparatus configured to supply various kinds of gases (a precursor gas, a reaction gas, a purge gas, etc.) onto a surface of the processing target substrate from an upper side thereof and to exhaust the various kinds of gases supplied onto the surface of the processing target substrate toward the upper side of the substrate.

The type of substrate processing apparatus includes a substrate mounting stand having a substrate mounting surface which supports a plurality of substrates along a circumferential direction, and a gas supply unit installed at a position to face the substrate mounting surface. The gas supply unit has a structure in which gases are alternately supplied with respect to the rotation direction of the substrate mounting stand. In the film forming process, films are formed on the substrates as the substrate mounting stand rotates at a lower side of the gas supply unit.

In case of rotating the substrate mounting stand having a plurality of substrates mounted thereon so that gases are alternately supplied onto the respective substrates, the respective gases are not mixed with one another and an amount of gases exposed onto the substrates is large, in terms of gas use efficiency or the like.

When gases are alternately supplied onto the substrates, the gases are also alternately supplied onto the surface of the substrate mounting stand which supports the substrates. Thus, a film is also formed on the substrate mounting stand. Since the film formed on the substrate mounting stand may adversely affect a film forming process, a cleaning process is periodically performed in the film forming apparatus. As one example of a cleaning method, a cleaning gas in a plasma state may be supplied into a process chamber.

However, in order to prevent the gases from being mixed or to allow the exposure amount of the gases to be large, as mentioned above, it is required to confine each of the gases within a specified space. The specified space may be, e.g., a space positioned below gas supply holes. If the cleaning gas is supplied in this structure, the cleaning gas is hardly diffused to spaces other than the specified space. Therefore, the cleaning process is performed unevenly on the substrate mounting stand. If the cleaning process is performed unevenly, over-etching by the cleaning gas may be incurred or a cleaning target is not sufficiently cleaned.

SUMMARY

The present disclosure provides some embodiments of a substrate processing apparatus, a semiconductor device manufacturing method and a program, which are capable of realizing an even and uniform cleaning.

According to an aspect of the present disclosure, there is provided a substrate processing apparatus. The substrate processing apparatus includes a process chamber configured to process substrates; a substrate mounting stand installed in the process chamber and configured to support the substrates along a circumferential direction; a rotating unit configured to rotate the substrate mounting stand; a first gas supply unit configured to supply a first gas from above the substrate mounting stand; a second gas supply unit configured to supply a second gas from above the substrate mounting stand; a third gas supply unit configured to supply a cleaning gas from above the substrate mounting stand; and an elevating unit configured to maintain the substrate mounting stand at a substrate processing position while supplying the first gas and the second gas and also configured to maintain the substrate mounting stand at a cleaning position while supplying the cleaning gas.

BRIEF DESCRIPTION OF THE DRAWINGS

FIG. 6 is a vertical sectional schematic view of the process chamber employed in the substrate processing apparatus according to the first embodiment of the present disclosure, which is taken along line D-D' in the process chamber shown in FIG. 4.

DETAILED DESCRIPTION

<First Embodiment of the Present Disclosure>

A first embodiment of the present disclosure will now be described in detail with reference to the drawings.

(1) Configuration of Substrate Processing Apparatus

Figure 1:
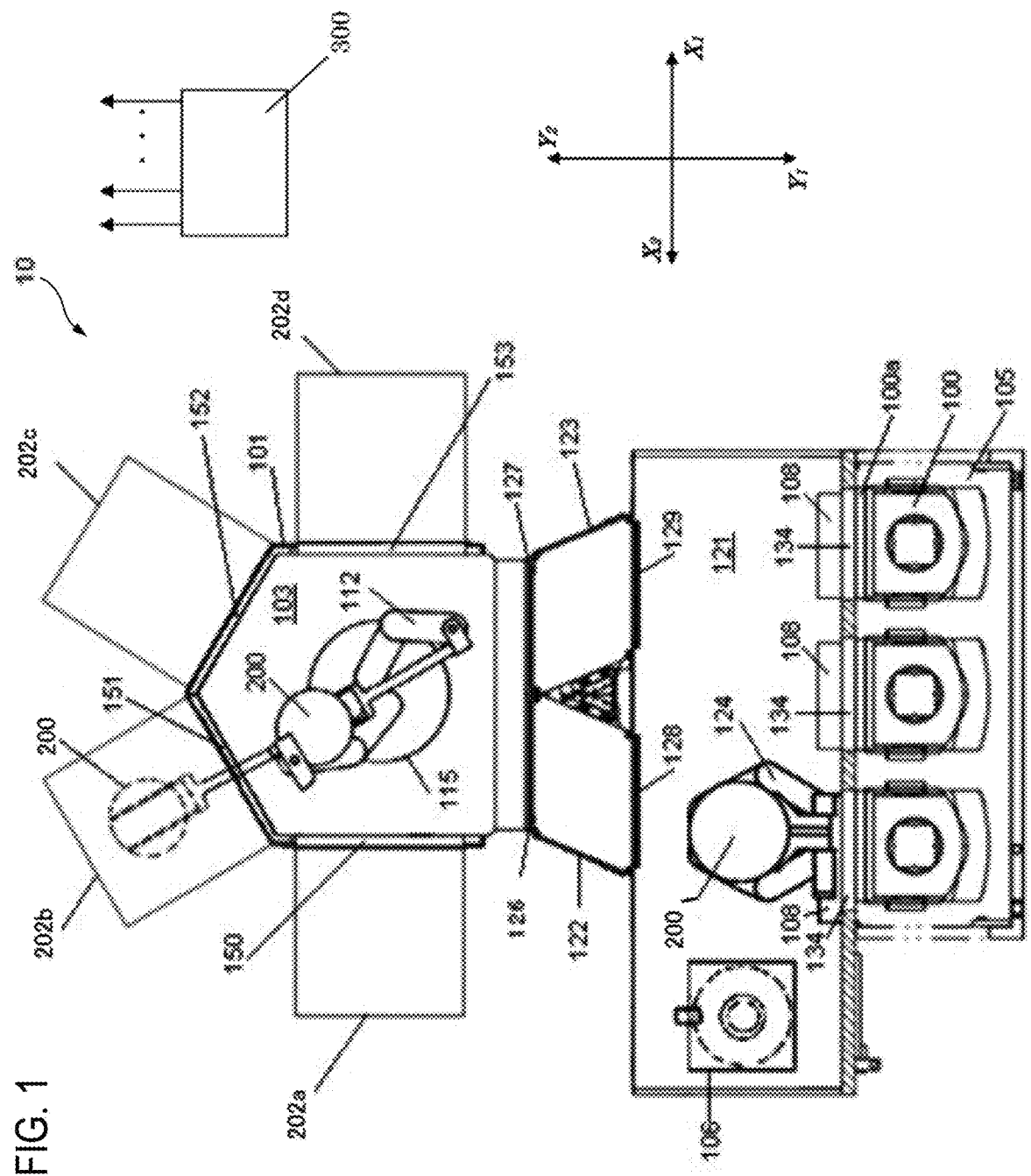
FIG. 1 is a horizontal sectional schematic view of a cluster-type substrate processing apparatus according to a first embodiment of the present disclosure.
Figure 2:
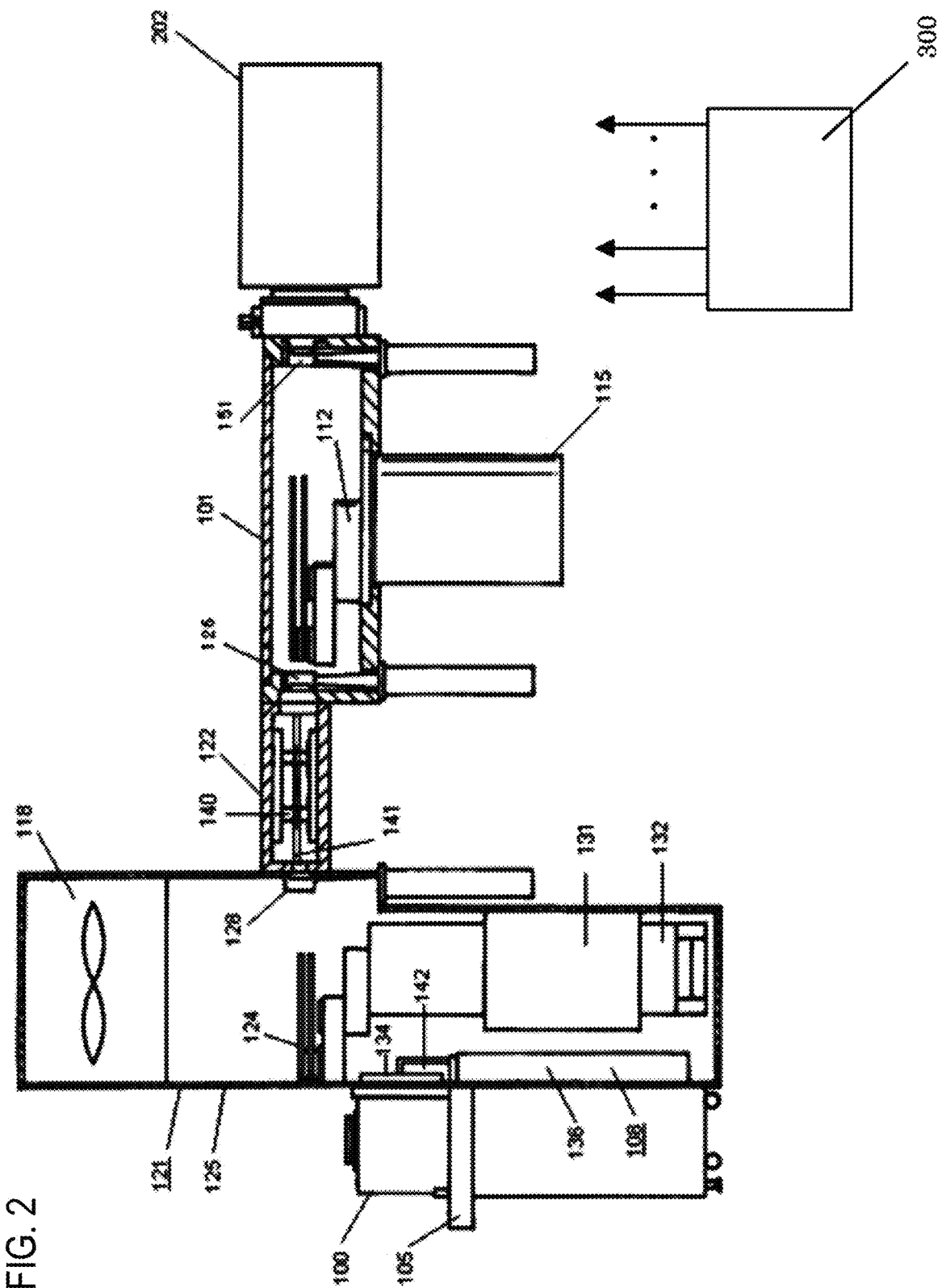
FIG. 2 is a vertical sectional schematic view of the cluster-type substrate processing apparatus according to the first embodiment of the present disclosure.

A substrate processing apparatus 10 according to the present embodiment will be first described with reference to FIGS. 1 and 2. FIG. 1 is a horizontal sectional view of the cluster-type substrate processing apparatus 10 according to the present embodiment. FIG. 2 is a vertical sectional schematic view of the cluster-type substrate processing apparatus 10 according to the present embodiment.

In the substrate processing apparatus 10 to which the present disclosure is applied, a FOUP (Front Opening Unified Pod, which will be hereinafter referred to as "pod") 100 is used as a carrier for transferring wafers 200 as substrates. A transfer device of the cluster-type substrate processing apparatus 10 according to the present embodiment includes a vacuum side and an atmosphere side.

In the following description, the front, rear, left and right sides are defined on the basis of the indications provided in FIG. 1. In FIG. 1, the direction of $X_1$ is the right side, the direction of $X_2$ is the left side, the direction of $Y_1$ is the front side, and the direction of $Y_2$ is the rear side.

(Vacuum Side Configuration)

As shown in FIGS. 1 and 2, the substrate processing apparatus 10 includes a first transfer chamber 103 capable of resisting a pressure (negative pressure) lower than an atmospheric pressure, such as a vacuum state or the like. A housing 101 of the first transfer chamber 103 has a box shape that is, e.g., a pentagonal shape, when viewed from a plane, with its upper and lower ends closed. The term "viewed from a plane" used herein means that the substrate processing apparatus 100 is viewed from a vertical upper side toward a vertical lower side.

Within the first transfer chamber 103, there is installed a first wafer transfer machine 112 that is configured to simultaneously transfer two sheets of wafers 200 under the negative pressure. Alternatively, the first wafer transfer machine 112 may be configured to transfer one sheet of the wafer 200. The first wafer transfer machine 112 is configured to be elevated by a first wafer transfer machine elevator 115 while maintaining the airtightness of the first transfer chamber 103.

Pre-chambers (load lock chambers) 122 and 123 are connected via gate valves 126 and 127 to a front sidewall of five sidewalls of the housing 101. The pre-chambers 122 and 123 are configured to be used in combination for carrying-in and carrying-out the wafers 200 to/from the pre-chambers 122 and 123 and to resist the negative pressure.

Within each of the pre-chambers 122 and 123, two sheets of the wafers 200 may be stacked by a substrate support 140. A partitioning plate (intermediate plate) 141 between the wafers 200 is installed in each of the pre-chambers 122 and 123.

A first process module 202a, a second process module 202b, a third process module 202c and a fourth process module 202d, in which desired processes are performed on the substrates, are respectively connected through gate valves 150, 151, 152 and 153 to four rear sidewalls of the five sidewalls of the housing 101 of the first transfer chamber 103 in a mutually adjoining relationship and arranged adjacent to each other. The first process module 202a, the second process module 202b, the third process module 202c and the fourth process module 202d will be described later in detail.

(Atmosphere Side Configuration)

A second transfer chamber 121 in which the wafers 200 are transferred under a vacuum pressure and an atmospheric pressure is connected through gate valves 128 and 129 to the front sides of the pre-chambers 122 and 123. A second substrate transfer machine 124 for transferring the wafers 200 is installed in the second transfer chamber 121. The second substrate transfer machine 124 is configured to be elevated by a second substrate transfer machine elevator 131 installed within the second transfer chamber 121 and to be enabled to reciprocate in a left-right direction by a linear actuator 132.

A notch aligning device 106 is installed on the left side of the second transfer chamber 121. The notch aligning device 106 may be an orientation flat aligning device. Furthermore, a clean unit 118 for supplying a clean air is installed at the top of the second transfer chamber 121.

Substrate carrying-in/out gates 134 for carrying the wafers 200 into/out of the second transfer chamber 121, and pod openers 108 are installed in the front side of a housing 125 of the second transfer chamber 121. A load port (IO stage) 105 is installed in the opposite side of the pod openers 108, that is, in the outside of the housing 125, with the substrate carrying-in/out gates 134 interposed therebetween. Each of the pod openers 108 includes a closure 142 that is capable of opening/closing a cap 100a of a pod 100 and blocking the substrate carry-in/out gates 134, and a drive mechanism 136 for driving the closure 142. By opening the cap 100a of the pod 100 mounted in the load port 105, it becomes possible to carry the wafers 200 into and out of the pod 100. Furthermore, the pod 100 may be supplied in and discharged from the load port 105 by an intra-process transfer device (e.g., an OHT) not shown in the drawings.

(2) Configuration of Process Chamber

Figure 3:
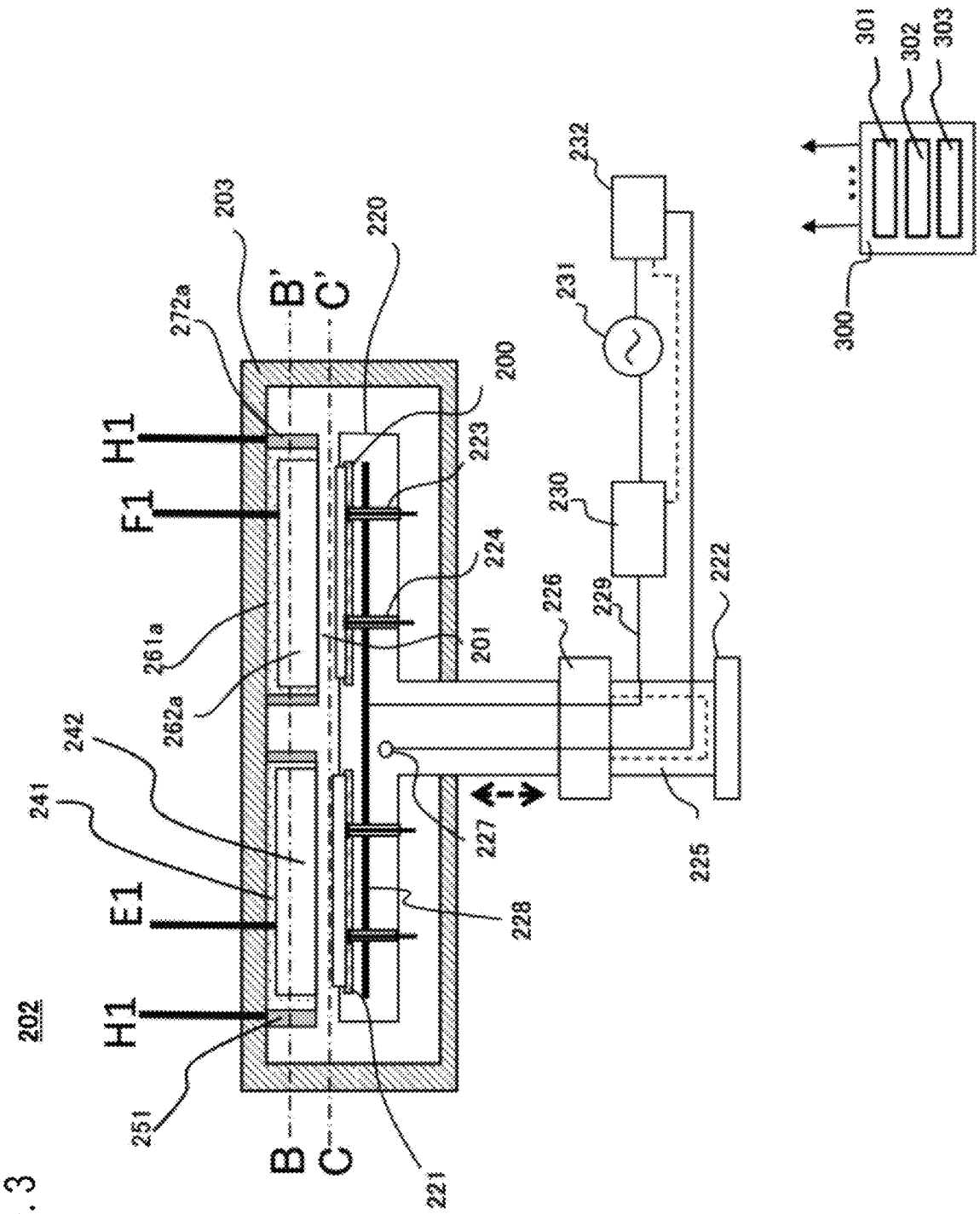
FIG. 3 is a vertical sectional schematic view of a process chamber employed in the substrate processing apparatus according to the first embodiment of the present disclosure.
Figure 4:
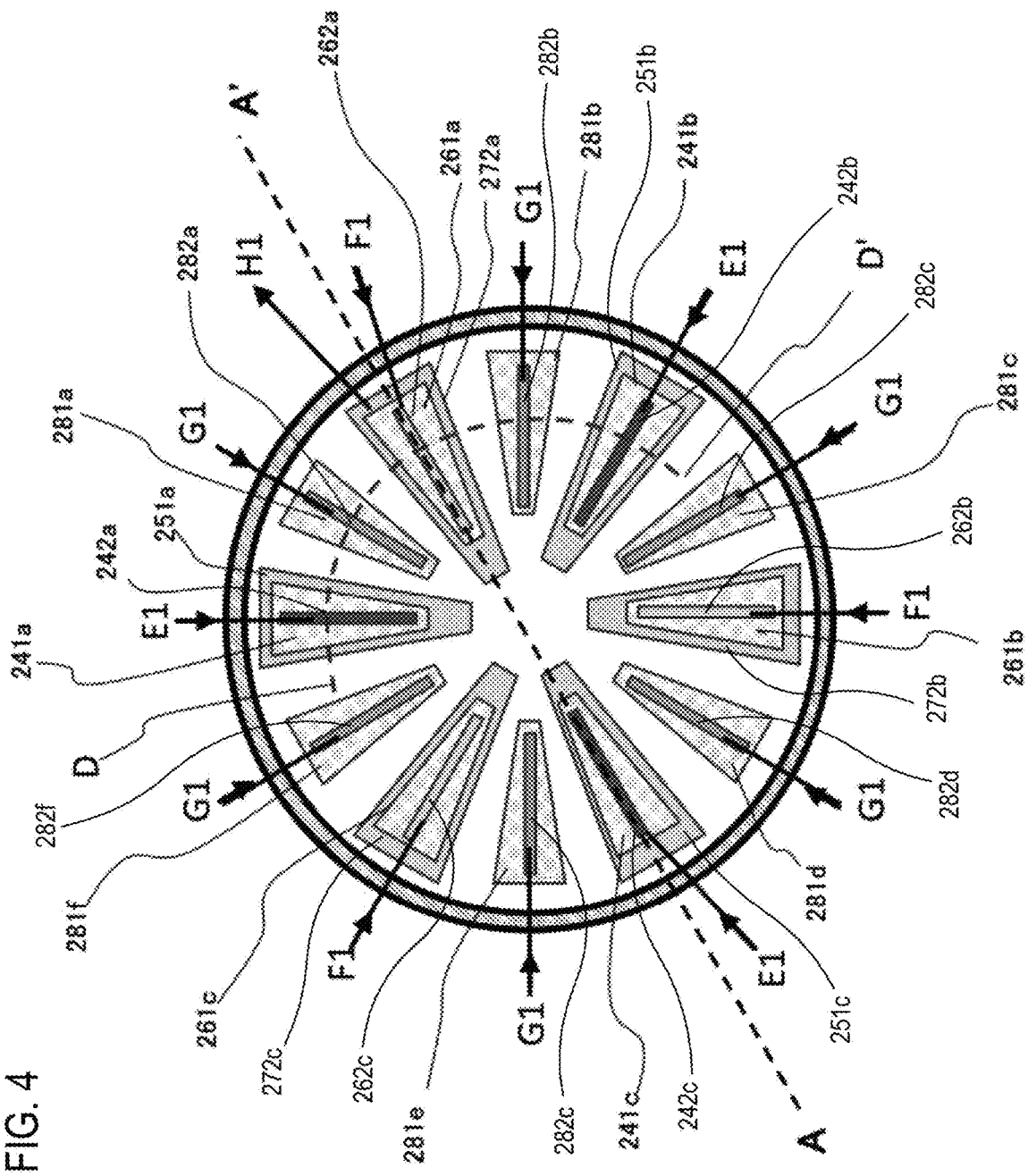
FIG. 4 is a horizontal sectional schematic view of the process chamber employed in the substrate processing apparatus according to the first embodiment of the present disclosure, which is taken along line B-B' in the process chamber shown in FIG. 3.
Figure 5:
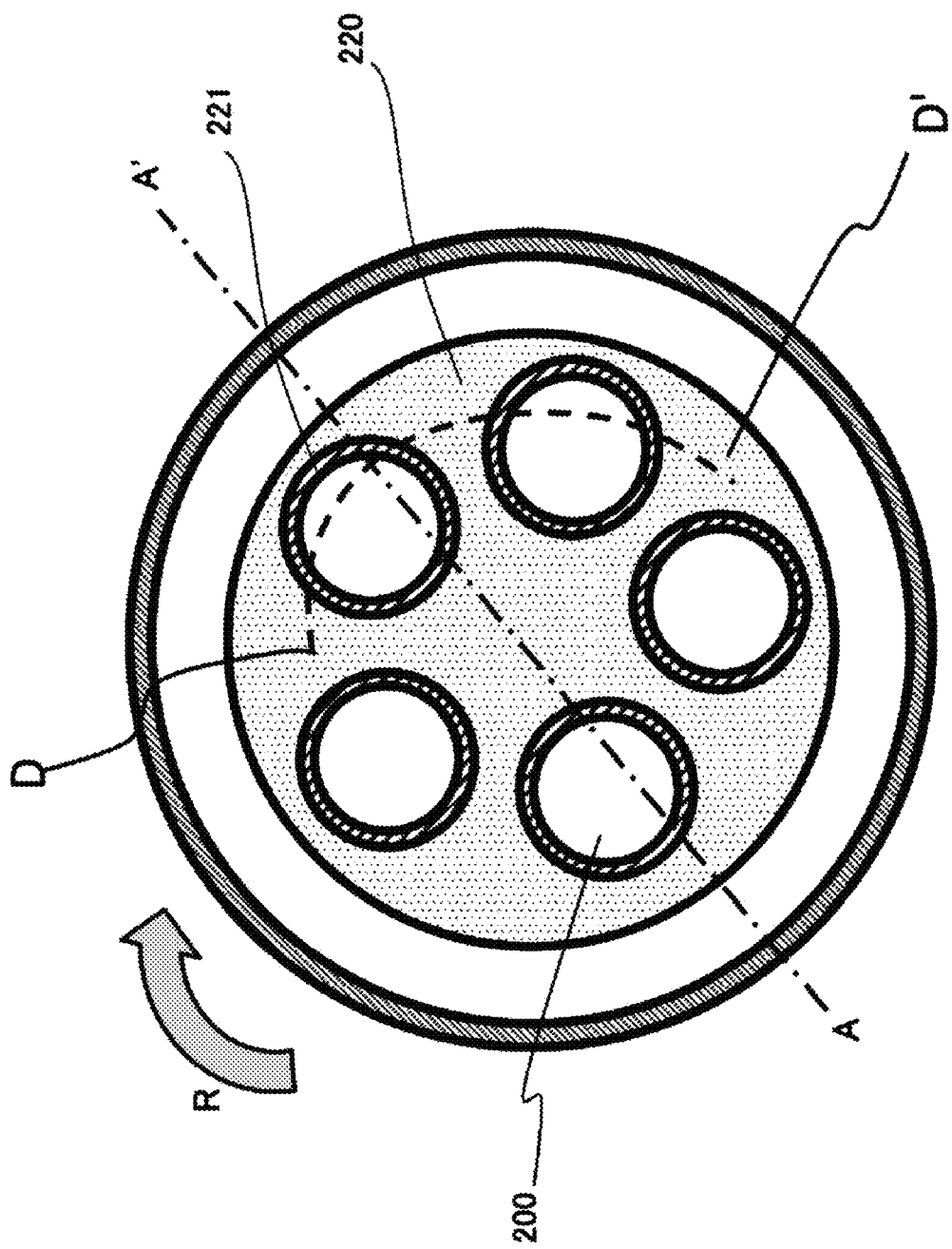
FIG. 5 is a horizontal sectional schematic view of the process chamber employed in the substrate processing apparatus according to the first embodiment of the present disclosure, which is taken along line C-C' in the process chamber shown in FIG. 3.
Figure 7A:
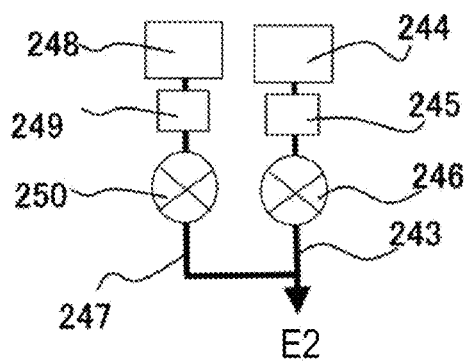
FIGS. 7A, 7B and 7C are explanatory views of gas supply units according to the first embodiment of the present disclosure.
Figure 7B:
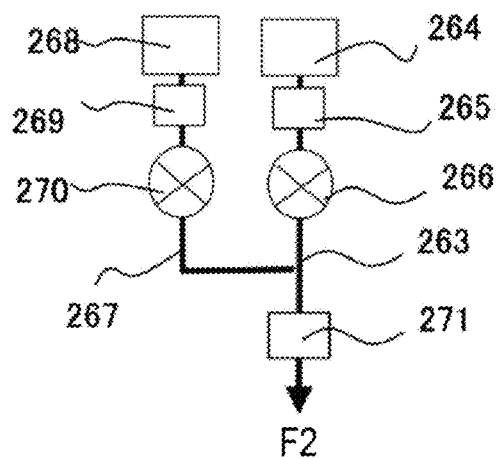
Figure 7C:
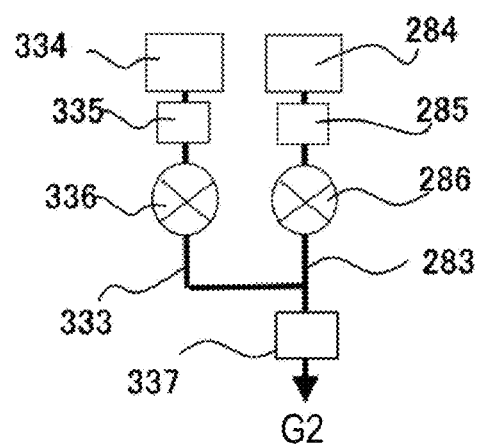
Figure 8:
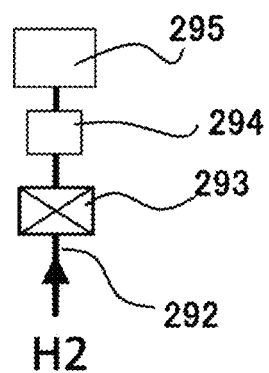
FIG. 8 is an explanatory view of a gas exhaust unit according to the first embodiment of the present disclosure.

Subsequently, the configuration of the process chamber as a process furnace according to the present embodiment will be described with reference to FIGS. 3 to 8. FIG. 3 is a vertical sectional schematic view of the process chamber employed in the substrate processing apparatus 10 according to the present embodiment, which is taken along line A-A' in FIGS. 4 and 5. FIG. 4 is a horizontal sectional schematic view of the process chamber employed in the substrate processing apparatus 10 according to the present embodiment, which is taken along line B-B' in the process chamber shown in FIG. 3. FIG. 5 is a horizontal sectional schematic view of the process chamber employed in the substrate processing apparatus 10 according to the present embodiment, which is taken along line C-C' in the process chamber shown in FIG. 3. FIG. 6 is a sectional view taken along line D-D' in in FIG. 4. FIGS. 7A, 7B and 7C are explanatory views explaining gas supply units. FIG. 8 is an explanatory view explaining a gas exhaust unit.

For the sake of convenience in description, relationships of the configurations shown in FIGS. 3 and 4 and the configurations shown in FIGS. 7A, 7B, 7C and 8 will be described as follows. Specifically, E1 shown in FIGS. 3 and 4 and E2 shown in FIG. 7A are connected to each other. In addition, F1 and F2 are connected to each other, G1 and G2 are connected to each other, and H1 and H2 are connected to each other.

In FIG. 4, for the sake of convenience in description, as indicated by H1-H2, only a gas supply structure 262a is shown to have an exhaust hole 272a connected to an exhaust pipe 292. However, the present disclosure is not limited thereto. Exhaust holes of other gas supply structures are also connected to the exhaust pipe 292.

In FIG. 4, with respect a first gas supply structure 241, it is shown that a gas supply hole 242a and a gas exhaust hole 251a are formed in a gas supply structure 241a. However, the present disclosure is not limited thereto. Specifically, a gas supply hole 242b and a gas exhaust hole 251b are also formed in a gas supply structure 241b having the same configuration as the gas supply structure 241a. Similarly, a gas supply hole 242c and a gas exhaust hole 251c are formed in a gas supply structure 241c.

In FIG. 4, with respect to a second gas supply structure 261, it is shown that a gas supply hole 262a and a gas exhaust hole 272a are formed in a gas supply structure 261a. However, the present disclosure is not limited thereto. Specifically, a gas supply hole 262b and a gas exhaust hole 272b are also formed in a gas supply structure 261b having the same configuration as the gas supply structure 261a. Similarly, a gas supply hole 262c and a gas exhaust hole 272c are formed in a gas supply structure 261c.

In FIG. 4, with respect to an inert gas supply structures 281, it is shown that a gas supply hole 282a is formed in a gas supply structure 281a. However, the present disclosure is not limited thereto. Specifically, a gas supply hole 282b is also formed in a gas supply structure 281b having the same configuration as the gas supply structure 281a. The same is also applied to gas supply structures 281b to 281f.

In the present embodiment, the first process module 202a, the second process module 202b, the third process module 202c and the fourth process module 202d are similarly configured. In the following description, the first process module 202a, the second process module 202b, the third process module 202c and the fourth process module 202d will be generically referred to as the "process module 202".

(Process Chamber)

As shown in FIGS. 3 to 5, the process module 202 as a process furnace is provided with a cylindrical sealed reaction container 203. The reaction container 203 is provided with a process chamber 201 for processing the wafers 200.

At the upper side of the interior of the reaction container 203, there are installed the gas supply structure 241 for supplying the first gas, the gas supply structure 261 for supplying the second gas and the gas supply structure 281 for supplying the inert gas. As shown in FIGS. 4 and 6, the gas supply structure 241, the gas supply structure 281, the gas supply structure 261 and the gas supply structure 281 are alternately arranged along the rotational direction R of a susceptor (substrate mounting stand) 220 (i.e., along the circumferential direction) which will be described.

In case of the gas supply structures 241, the gas supply structure 241a, the gas supply structure 241b and the gas supply structure 241c are sequentially disposed along the circumferential direction. In case of the gas supply structures 261, the gas supply structure 261a, the gas supply structure 261b and the gas supply structure 261c are sequentially disposed along the circumferential direction. In case of the gas supply structures 281, the gas supply structure 281a, the gas supply structure 281b, the gas supply structure 281c, the gas supply structure 281d and the gas supply structure 281f are sequentially disposed along the circumferential direction.

In each of the gas supply structures 241, a first gas supply hole 242 for supplying a first gas is installed. In addition, an exhaust hole 251 is installed in the horizontal-direction outer periphery of the first gas supply hole 242. In each of the gas supply structures 261, a second gas supply hole 262 for supplying a second gas is installed. In addition, an exhaust hole 272 is installed in the horizontal-direction outer periphery of the second gas supply hole 262. In each of the gas supply structures 281, an inert gas supply hole 282 for supplying an inert gas is installed.

Thus, along the circumferential direction, the exhaust hole 251, the first gas supply hole 242, the exhaust hole 251, the inert gas supply hole 282, the exhaust hole 272, the second gas supply hole 262, the exhaust hole 272 and the inert gas supply hole 282 are disposed in this order.

The lower ends of the respective gas supply holes are disposed as closely to the susceptor 220 as possible so as not to interfere with the wafers 200. This makes it possible to increase the exposure amount of gases to the wafers 200, thereby realizing film thickness uniformity of the films formed on the wafers and an increase of use efficiency of gases.

In order to increase the exposure amount of the gases, a pressure may be increased. As one way to increase a pressure, the area of a bottom wall of a gas supply structure may be allowed to be large to prevent the gases from escaping.

(Susceptor)

At the lower side of the gas supply holes, namely at the bottom-side center of the interior of the reaction container 203, a susceptor 220 as a rotatable substrate mounting stand is installed. The susceptor 220 has its center of rotation at the center of the reaction container 203. The susceptor 220 is made of a nonmetallic material such as, e.g., aluminum nitride (AlN), ceramics or quartz, so as to reduce metal contamination of the wafers 200. Furthermore, the susceptor 220 is electrically insulated from the reaction container 203.

The susceptor 220 is configured to support a plurality of (e.g., five, in the present embodiment) wafers 200 arranged on the same plane along the same circumference within the reaction container 203. The term "same plane" used herein is not limited to the completely same plane. The plurality of wafers 200 are allowed to be arranged in a non-overlapping manner when viewed from above the susceptor 220. Moreover, the susceptor 220 is configured to allow the wafers 200 to be arranged side by side along the rotational direction.

Wafer mounting members 221 are installed at supporting positions of the wafers 200 on the surface of the susceptor 220. The same number of wafer mounting members 221 as the number of wafers 200 to be processed are arranged at the positions on the same circumference from the center of the susceptor 220 with an equal interval (e.g., at an interval of 72 degrees).

Each of the wafer mounting members 221 has, e.g., a circular shape when viewed from the upper surface of the susceptor 220 and has, e.g., a concave shape when viewed from the side surface of the susceptor 220. In this case, the diameter of each wafer mounting member 221 may be slightly larger than that of the wafers 200. Mounting the wafer 200 in the wafer mounting member 221 facilitates positioning of the wafer 200 and can prevent any dislocation of the wafer 200 which may occur, for example, when the wafer 200 is dislocated from the susceptor 217 due to a centrifugal force caused by the rotation of the susceptor 217.

The susceptor 220 is provided with an elevating instrument 222 to elevate the susceptor 220 up and down. The elevating instrument 222 is connected to a controller 300 that will be described later and elevate the susceptor 220 up and down according to instructions from the controller 300. The controller 300 controls the susceptor 220 to change its position among three positions, namely a substrate processing position, a cleaning position and a wafer transfer position so that the relative distance between the respective gas supply holes and the susceptor is changed. Each of the wafer mounting members 221 of the susceptor 220 is provided with a plurality of through-holes 223. Wafer lift pins 224 are installed in the respective through-holes 223. In a substrate loading/unloading, the susceptor 220 is descended to a transfer position so that the lower ends of the wafer lift pins 224 are in contact with the bottom surface of the reaction container 203. The wafer lift pins 224 are pushed upward to a position higher than the surfaces of the wafer mounting members 221. In this way, the wafers 200 are raised from the surfaces of the wafer mounting members 221 to be loaded/unloaded.

A rotating mechanism 225 for rotating the susceptor 220 is installed in the shaft of the susceptor 220. The rotating mechanism 225 has a rotary shaft connected to the susceptor 220. It is possible to rotate the susceptor 220 by operating the rotating mechanism 225. Furthermore, the wafer mounting members 221 are configured to simultaneously rotate as the susceptor 220 is rotated.

The controller 300 to be described later is connected to the rotating mechanism 225 through a coupling unit 226. The coupling unit 226 is formed as, e.g., a slip ring mechanism to electrically interconnect a rotating side and a fixed side using a metal brush or the like. Thus, the rotation of the susceptor 220 is not disturbed. The controller 300 is configured to control a state of electrical conduction to the rotating mechanism 225 so as to rotate the susceptor 220 at a predetermined speed for a predetermined time.

(Heating Unit)

A heater 228 as a heating unit is unitarily embedded in the susceptor 220 to heat the wafers 200. Upon supplying electric power to the heater 228, the surfaces of the wafers 200 are heated to a predetermined temperature (e.g., room temperature to 1,000 degrees C.). A plurality of (e.g., five) heaters 228 may be installed on the same plane to independently heat the respective wafers 200 mounted on the susceptor 220.

A temperature sensor 227 is installed in the susceptor 220. The heater 228 and the temperature sensor 227 are electrically connected to a power adjuster 230, a heater power source 231 and a temperature regulator 232 through a power supply line 229. A state of the power supply to the heater 228 is controlled based on the temperature information detected by the temperature sensor 227.

(Gas Supply Unit)

At the upper side of the process chamber, the gas supply structure 241, the gas supply structure 261 and the gas supply structure 281 are installed to have a radial pattern when viewed from a center of a ceiling portion. The gas supply structure 241, the gas supply structure 261 and the gas supply structure 281 are configured to protrude from the ceiling, when viewed from the ceiling toward the susceptor 220. For that reason, the gas supply structure 241, the gas supply structure 261 and the gas supply structure 281 will be referred to as convex members.

The gas supply structure 241 has the first gas supply hole 242 for supplying a first gas and the exhaust hole 251 formed in the horizontal-direction outer periphery of the first gas supply hole 242. The gas supply structure 261 has the second gas supply hole 262 for supplying a second gas and the exhaust hole 272 formed in the horizontal-direction outer periphery of the second gas supply hole 262. The gas supply structure 281 has the inert gas supply hole 282 for supplying an inert gas.

The gas supply structure 241, the gas supply structure 281 and the gas supply structure 261 are installed along the circumferential direction in this order. Accordingly, along the circumferential direction, the exhaust hole 251, the first gas supply hole 242, the exhaust hole 251, the inert gas supply hole 282, the exhaust hole 272, the second gas supply hole 262, the exhaust hole 272 and the inert gas supply hole 282 are disposed in this order.

The first gas supply hole 242, the second gas supply hole 262 and the inert gas supply hole 282 have a slit structure extending in a radial direction of the susceptor 220. The width of each gas supply hole in the susceptor diameter direction is set at least larger than the diameter of the wafers 200 so that the gases can be supplied to the entire surfaces of the wafers 200 passing through the lower side of the respective gas supply holes.

The exhaust hole 251 is formed to horizontally surround the first gas supply hole 242. The exhaust hole 251 is configured to exhaust the first gas failing to adhere to the surfaces of the wafers 200 and the susceptor 220 and the inert gas supplied from the inert gas supply hole 282 adjoining the exhaust hole 251. With this configuration, the first gas can be prevented from being mixed with the second gas supplied to the adjoining space.

The exhaust hole 251 is formed not only between the first gas supply hole 242 and the inert gas supply holes 282 adjoining thereto but also, e.g., at the center side of the process chamber and at the outer periphery side of the process chamber with respect to the gas supply hole.

By forming the exhaust hole 251 at the center side of the process chamber, it is possible to prevent a large amount of gas from flowing toward the center of the process chamber or adjoining gas supply regions through the center of the process chamber. In the following description, the portion of the exhaust hole 251 existing at the center side of the process chamber will be often referred to as "inner peripheral gas movement restraint portion".

By forming the exhaust hole 251 at the outer periphery side of the process chamber, it is possible to prevent a large amount of gas from flowing toward the wall of the process chamber. In the following description, the portion of the exhaust hole 251 existing at the outer periphery side of the process chamber will be often referred to as "outer peripheral gas movement restraint portion".

The exhaust hole 272 is formed to horizontally surround the second gas supply hole 262. The exhaust hole 272 is configured to exhaust the second gas failing to adhere to the surfaces of the wafers 200 and the susceptor 220 and the inert gas supplied from the inert gas supply hole 282 adjoining the exhaust hole 272. With this configuration, the second gas can be prevented from being mixed with the first gas supplied to the adjoining space.

The exhaust hole 272 is formed not only between the second gas supply hole 262 and the inert gas supply holes 282 adjoining thereto but also, e.g., at the center side of the process chamber and at the outer periphery side of the process chamber with respect to the gas supply hole.

By forming the exhaust hole 272 at the center side of the process chamber, it is possible to prevent a large amount of gas from flowing toward the center of the process chamber or the adjoining gas supply regions through the center of the process chamber. In the following description, the portion of the exhaust hole 272 existing at the center side of the process chamber will be often referred to as "inner peripheral gas movement restraint portion".

By forming the exhaust hole 272 at the outer periphery side of the process chamber, it is possible to prevent a large amount of gas from flowing toward the wall of the process chamber. In the following description, the portion of the exhaust hole 272 existing at the outer periphery side of the process chamber will be often referred to as "outer peripheral gas movement restraint portion".

The inner peripheral gas movement restraint portion of the exhaust hole 251 and the inner peripheral gas movement restraint portion of the exhaust hole 272 may be collectively referred to as the "inner peripheral gas movement restraint portion". Likewise, the outer peripheral gas movement restraint portion of the exhaust hole 251 and the outer peripheral gas movement restraint portion of the exhaust hole 272 may be collectively referred to as the "outer peripheral gas movement restraint portion".

When the arrangement of the gas supply structure 241, the gas supply structure 281 and the gas supply structure 261, in the circumferential direction, is viewed from the side, the gas supply structure 241, the gas supply structure 281 and the gas supply structure 261 are disposed as shown in FIG. 6. That is to say, the exhaust hole 251 of the gas supply structure 241, the first gas supply hole 242, the exhaust hole 251 of the gas supply structure 241, the inert gas supply hole 281, the exhaust hole 272 of the gas supply structure 261, the second gas supply hole 262, the exhaust hole 272 of the gas supply structure 261 and the inert gas supply hole 282 are disposed in this order along the circumferential direction.

(First Gas Supply Unit)

A first gas supply pipe 243 is divided into a plurality of gas supply pipes at the downstream side of a distribution portion (not shown). The divided gas supply pipes are respectively connected to the gas supply structures 241a to 241c. A first gas source 244 is connected to the upstream end of the first gas supply pipe 243. A mass flow controller (MFC) 245 as a flow rate controller (flow rate control unit) and an on/off valve 246 are installed between the first gas source 244 and the distribution portion in this order from the upstream side.

In the first gas supply pipe 243, a gas containing a first element (hereinafter referred to as "first-element-containing gas" or "first gas") is supplied to the gas supply structure 241 through the mass flow controller 245 and the valve 246.

The first-element-containing gas is a precursor gas, namely one of process gases. In the present embodiment, the first element is, e.g., titanium (Ti). In other words, the first-element-containing gas is, e.g., a titanium-containing gas. The first-element-containing gas may be any one of solid, liquid and gas under the room temperature and the atmospheric pressure. If the first-element-containing gas is in a liquid phase under the room temperature and the atmospheric pressure, a vaporizer (not shown) may be interposed between the first gas source 244 and the mass flow controller 245. A description below will be made here under the assumption that the first-element-containing gas is a gas.

A downstream end of a first inert gas supply pipe 247 is connected to the first gas supply pipe 243 at the downstream side of the valve 246. An inert gas source 248, a mass flow controller (MFC) 249 as a flow rate controller (flow rate control unit) and an on/off valve 250 are installed in the first inert gas supply pipe 247 in this order from the upstream side.

In the present embodiment, the inert gas is, e.g., a nitrogen ($N_2$) gas. As the inert gas, it may be possible to use not only the $N_2$ gas but also a rare gas such as, a helium (He) gas, a neon (Ne) gas or an argon (Ar) gas.

The gas supply structure 241, the gas supply hole 242, the first gas supply pipe 243, the MFC 245 and the valve 246 will be collectively referred to as a "first gas supply unit 240".

A first inert gas supply unit is mainly constituted by the first inert gas supply pipe 247, the mass flow controller 249 and the valve 250. Furthermore, the inert gas source 248 and the first gas supply pipe 243 may be included in the first inert gas supply unit. Moreover, any one of the first gas source 244, the first inert gas supply unit and the gas exhaust hole 251 or the combination thereof may be included in the first gas supply unit.

In the present embodiment, it is described as the gas supply structure 241 including three gas supply structures 241a to 241c. However, the present disclosure is not limited thereto. It may be possible to use four or more gas supply structures.

(Second Gas Supply Unit)

A second gas supply pipe 263 is divided into a plurality of gas supply pipes at the downstream side of a distribution portion (not shown). The divided gas supply pipes are respectively connected to the gas supply structures 261a to 261c. A second gas source 264 is connected to the upstream end of the second gas supply pipe 263. A mass flow controller (MFC) 265 as a flow rate controller (flow rate control unit) and an on/off valve 266 are installed between the second gas source 264 and the distribution portion in this order from the upstream side.

In the second gas supply pipe 263, a gas containing a second element (hereinafter referred to as "second-element-containing gas" or "second gas") is supplied to the gas supply structure 261 through the mass flow controller 265 and the valve 266.

The second-element-containing gas is a reaction gas, namely one of process gases. In the present embodiment, the second element is, e.g., nitrogen (N). In other words, the second-element-containing gas is, e.g., a nitrogen-containing gas.

A downstream end of a second inert gas supply pipe 267 is connected to the second gas supply pipe 263 at the downstream side of the valve 266. An inert gas source 268, a mass flow controller (MFC) 269 as a flow rate controller (flow rate control unit) and an on/off valve 270 are installed in the second inert gas supply pipe 267 in this order from the upstream side.

A remote plasma unit 271 is installed between the distribution portion of the second gas supply pipe 263 and the downstream end of the second inert gas supply pipe 267. The remote plasma unit 271 is configured to excite the gases passing therethrough into a plasma state. In the present embodiment, the remote plasma unit 271 excites the second-element-containing gas into a plasma state.

In the present embodiment, the inert gas is, e.g., a nitrogen ($N_2$) gas. As the inert gas, it may be possible to use not only the $N_2$ gas but also a rare gas such as, a helium (He) gas, a neon (Ne) gas or an argon (Ar) gas.

The gas supply structure 261, the gas supply hole 262, the second gas supply pipe 263, the MFC 265 and the on/off valve 266 will be collectively referred to as a "second gas supply unit 260".

A second inert gas supply unit is mainly constituted by the second inert gas supply pipe 267, the mass flow controller 269 and the valve 270. Furthermore, the inert gas source 268 and the second gas supply pipe 263 may be included in the second inert gas supply unit. Moreover, any one of the second gas source 264, the second inert gas supply unit, the remote plasma unit 271 and the exhaust hole 272 or the combination thereof may be included in the second gas supply unit.

In the present embodiment, it is described as the gas supply structure 261 including three gas supply structures 261a to 261c. However, the present disclosure is not limited thereto. It may be possible to use four or more gas supply structures.

(Third Gas Supply Unit)

A third inert gas supply pipe 283 is divided into a plurality of gas supply pipes at the downstream side of a distribution portion (not shown). The divided gas supply pipes are respectively connected to the third gas supply structures 281a to 281f. An inert gas source 284 is connected to the upstream end of the third inert gas supply pipe 283. A mass flow controller (MFC) 285 as a flow rate controller (flow rate control unit) and an on/off valve 286 are installed between the inert gas source 284 and the distribution portion in this order from the upstream side.

In the third inert gas supply pipe 283, an inert gas is supplied to the gas supply structure 281 through the mass flow controller 285 and the valve 286.

In the present embodiment, the inert gas is, e.g., a nitrogen ($N_2$) gas. As the inert gas, it may be possible to use not only the $N_2$ gas but also a rare gas such as, a helium (He) gas, a neon (Ne) gas or an argon (Ar) gas.

A downstream end of a cleaning gas supply pipe 333 is connected to the third inert gas supply pipe 283 at the downstream side of the valve 286. A cleaning gas source 334, a mass flow controller (MFC) 335 as a flow rate controller (flow rate control unit) and an on/off valve 336 are installed in the cleaning gas supply pipe 333 in this order from the upstream side.

A remote plasma unit 337 is installed between the distribution portion of the third inert gas supply pipe 283 and the downstream end of the cleaning gas supply pipe 333. The remote plasma unit 337 is configured to excite the gases passing therethrough into a plasma state. During a cleaning process to be described below, the remote plasma unit 337 operates to excite the cleaning gas into a plasma state.

The cleaning gas is supplied to the process chamber 201 through the mass flow controller 335 and the valve 336 in the cleaning gas supply pipe 333, the remote plasma unit 337 and the third inert gas supply pipe 283.

In the cleaning process, the cleaning gas supplied from the cleaning gas source 334 acts as a cleaning gas for removing byproducts adhering to the susceptor 220 and the process chamber wall.

In the present embodiment, the cleaning gas is, e.g., a nitrogen trifluoride ($NF_3$) gas. As the cleaning gas, it may be possible to use, e.g., a hydrogen fluoride (HF) gas, a chlorine trifluoride ($ClF_3$) gas and a fluorine ($F_2$) gas, either independently or in combination.

The gas supply structure 281, the gas supply hole 282, the third inert gas supply pipe 283, the MFC 285 and the on/off valve 286 will be collectively referred to as a "third gas supply unit (or inert gas supply unit) 280". The inert gas source 284 may be included in the third gas supply unit.

A cleaning gas supply unit is mainly constituted by the cleaning gas supply pipe 333, the mass flow controller 335 and the valve 336. The cleaning gas source 334, the remote plasma unit 337 and the third inert gas supply pipe 283 may be included in the cleaning gas supply unit. Moreover, the cleaning gas supply unit may be included in the third gas supply unit.

In the present embodiment, it is described that the gas supply structure 281 includes six gas supply structures 281a to 281f. However, the present disclosure is not limited thereto. It may be possible to use seven or more gas supply structures.

While the cleaning gas supply pipe 333 is shown to be connected to the third inert gas supply pipe 283, the present disclosure is not limited thereto. For example, just like the third inert gas supply pipe 283, the cleaning gas supply pipe 333 may be connected to the gas supply structure 281. In this case, the remote plasma unit 337 is installed in the cleaning gas supply pipe 333.

(Exhaust Unit)

As shown in FIGS. 4 and 8, the exhaust holes 251 and the exhaust holes 272 formed in the respective gas supply structures are merged in a merging portion (not shown) of the exhaust pipe 292. On the downstream side from the merging portion in the exhaust pipe 292, an on/off valve 293, an APC (Auto Pressure Controller) valve 294 as a pressure regulator (pressure regulating unit) and a pump 295 are disposed in this order from the upstream side.

The internal pressure of the process chamber 201 can reach a predetermined pressure (degree of vacuum) through a vacuum-exhaust. The APC valve 294 is an on/off valve that facilitates or stops the vacuum-exhaust in the process chamber 201 by opening/closing the valve and further facilitates pressure regulation by regulating the degree of valve opening. An exhaust unit is mainly configured by the exhaust hole 251, the exhaust hole 272, the exhaust pipe 292, the valve 293 and the APC valve 294. A pressure sensor and a vacuum pump may be included in the exhaust unit.

The exhaust hole 251 and the exhaust hole 272 will be referred to as an "upper exhaust hole" in order to distinguish them from a lower exhaust hole 311. The lower exhaust hole 311 will be referred to as the "lower exhaust hole." Moreover, the exhaust hole 251 will be referred to as a first upper exhaust hole and the exhaust hole 272 will be referred to as a "second upper exhaust hole".

(Control Unit)

The substrate processing apparatus 10 includes a controller (control unit) 300 configured to control the operations of the respective units of the substrate processing apparatus 10. The controller 300 includes at least an arithmetic unit 301 and a storage unit 302. The controller 300 is connected to the respective units described above. Responsive to instructions of a host controller or a user, the controller 300 invokes a program or a recipe from the storage unit 302 and controls the operations of the respective units depending on the contents of the program or the recipe. The controller 300 may be configured by either a dedicated computer or a general-purpose computer. For example, the controller 300 of the present embodiment may be configured by preparing an external memory device (e.g., a magnetic tape, a magnetic disk such as a flexible disk or a hard disk, an optical disk such as a CD or a DVD, a magneto-optical disk such as an MO or the like, or a semiconductor memory such as a USB memory (USB flash drive) or memory card) 303 that stores the aforementioned program, and installing the program in the general-purpose computer through the use of the external memory device 303. A means for supplying the program to the computer is not limited to the case where the program is supplied through the external memory device 303. For example, the program may be supplied through the use of a communication means such as the Internet or a dedicated line, rather than through the external memory device 303. The storage unit 302 or the external memory device 303 is configured as a non-transitory computer-readable recording medium. Hereinafter, these means for supplying the program will be simply referred to as a "recording medium". When the term "recording medium" is used herein, it may include a case in which only the storage unit 302 is included, a case in which only the external memory device 303 is included, or a case in which both the storage unit 302 and the external memory device 303 are included.

(Substrate Processing Process)

Figure 9:
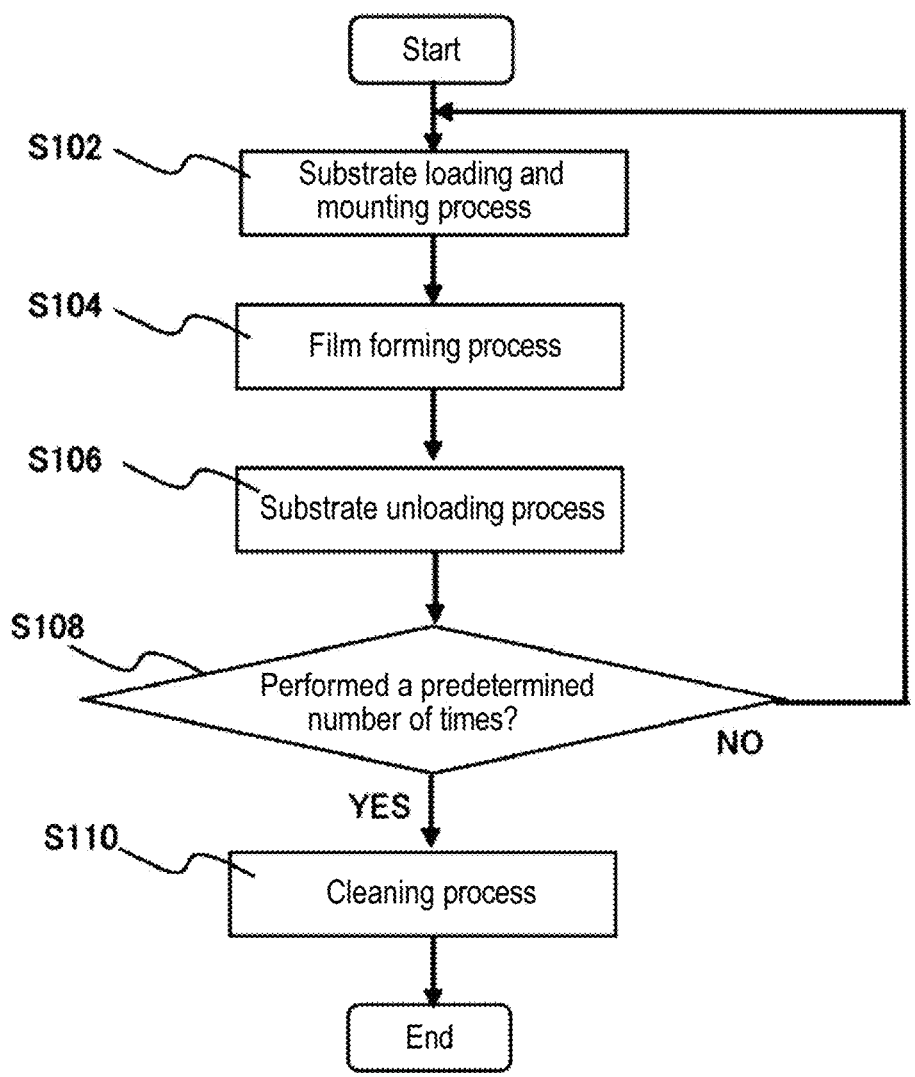
FIG. 9 is a flowchart showing a substrate processing process according to the first embodiment of the present disclosure.
Figure 10:
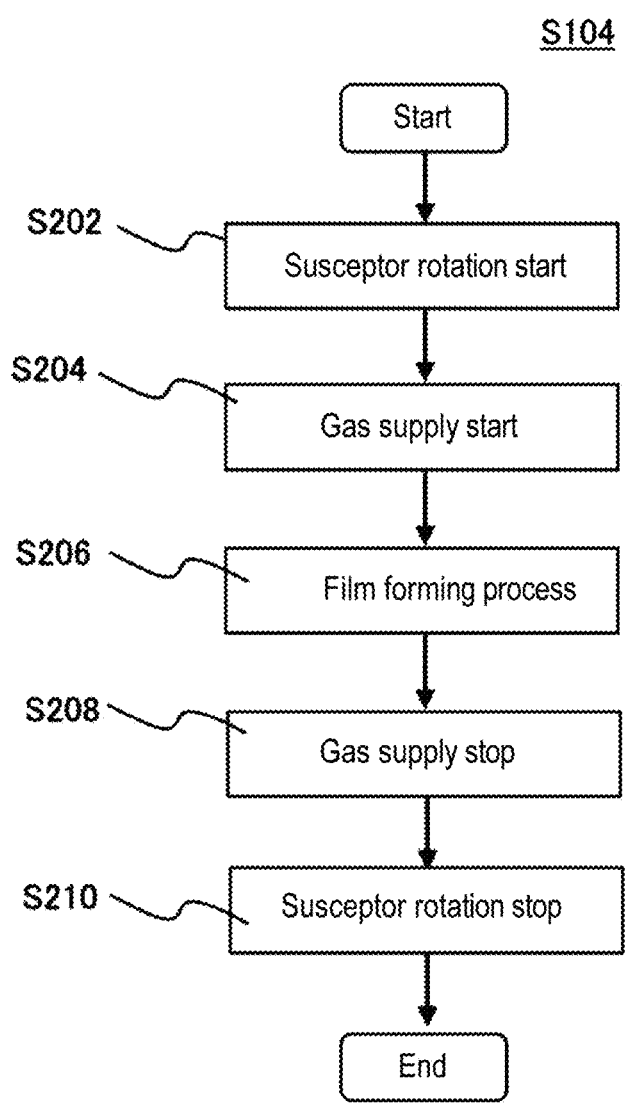
FIG. 10 is a flowchart showing a film forming process according to the first embodiment of the present disclosure.

Next, a substrate processing process performed by a substrate processing apparatus provided with the process module 202 according to the present disclosure, which is one process of a semiconductor device manufacturing process, will be described. First, an outline of the substrate processing process will be described with reference to FIGS. 9 and 10. FIG. 9 is a flowchart showing the substrate processing process according to the present embodiment. FIG. 10 is a flowchart showing a film forming process according to the present embodiment. In the following description, the operations of respective parts of the process module 202 in the substrate processing apparatus 10 are controlled by the controller 300.

Here, an example in which titanium nitride films are formed on the wafers 200 with a $TiCl_4$ gas as the first-element-containing gas and an ammonia ($NH_3$) gas as the second-element-containing gas will be described. In addition, for example, some films may be previously formed on the wafers 200. Some patterns may be also previously formed on the wafers 200 or the films thereon.

(Substrate Loading and Mounting Process (S102))

The pod 100 accommodating at most 25 sheets of the wafers 200 therein is, for example, transferred by an in-process transfer device and is placed on the load port 105. The cap 100a of the pod 100 is removed by the pod opener 108, whereby a substrate loading/unloading opening of the pod 100 is opened. The second substrate transfer machine 124 picks up one of the wafers 200 from the pod 100 and puts it on the notch aligning device 106. The notch aligning device 106 performs position adjustment of the wafer 200. The second substrate transfer machine 124 transfers the wafer 200 from the notch aligning device 106 into the pre-chamber 122 under the atmospheric pressure. The gate valve 128 is closed and the interior of the pre-chamber 122 is exhausted to a negative pressure by an exhaust device (not shown).

In the process module 202, the susceptor 220 is moved and maintained at the transfer position of the wafers 200, namely the substrate mounting position. In the present embodiment, the susceptor 220 is descended. If the susceptor 220 is descended, the wafer lift pins 266 installed in the through-holes 223 are lifted up so that the wafer lift pins 266 protrude by a predetermined height beyond the surface of the susceptor 220. Subsequently, certain gate valves are opened so that a predetermined number of (e.g., five) wafers 200 (processing target substrates) are loaded into the process chamber 201 with the vacuum transfer robot 112. Then, the wafers 200 are loaded on the susceptor 220 in a non-overlapping manner around the rotary shaft of the susceptor 220 along the rotational direction. Thus, the wafers 200 are horizontally supported on the wafer lift pins 266 protruding from the surface of the susceptor 220.

After the wafers 200 are loaded into the process chamber 201, the first transfer robot 112 is evacuated out of the process module 202 and the gate valve is closed to seal the interior of the reaction container 203. Thereafter, the susceptor 220 is moved and maintained at the substrate processing position. In the present embodiment, the susceptor 220 is ascended. When the susceptor 220 is ascended, the wafers 200 are mounted on the respective wafer mounting members 221 installed on the susceptor 220.

When the wafers 200 are loaded into the process chamber 201, while exhausting the interior of the process chamber 201 with the exhaust unit, a $N_2$ gas as an inert gas may be supplied from the third gas supply unit into the process chamber 201. That is, the $N_2$ gas may be supplied into the process chamber 201 by opening at least the valves 250, 270 and 286 in a state in which the interior of the process chamber 201 is exhausted by actuating the pump 295 and opening the APC valve 294. Thus, it is possible to prevent introduction of particles into the process chamber 201 and adhesion of particles onto the wafers 200. The pump 295 keeps actuated until at least the substrate loading and mounting process (S102) to a later-described substrate unloading process (S106) are terminated.

When the wafers 200 are mounted on the susceptor 220, electric power is supplied to the heater 228 embedded within the susceptor 220 so that the temperature of the surfaces of the wafers 200 is controlled to become a predetermined temperature. The temperature of the wafers 200 is, e.g., from the room temperature to 700 degrees C. The temperature of the wafers may be, from the room temperature to 500 degrees C. At this time, the temperature of the heater 228 is regulated by controlling the state of power supply to the heater 228 based on the temperature information detected by the temperature sensor 227.

If the wafers are made of silicon, when the surfaces of the wafers 200 are heated to a temperature of 750 degrees C. or higher in the heating process, diffusion of impurities may occur in source or drain regions on the surfaces of the wafers 200 so that the circuit characteristics may be deteriorated and the performance of the semiconductor device may be reduced. By limiting the temperature of the wafers 200 as mentioned above, it is possible to suppress diffusion of impurities in source or drain regions on the surfaces of the wafers 200, deterioration of the circuit characteristics, and reduction of the performance of the semiconductor device.

(Thin Film Forming Process (S104))

Next, a thin film forming Process S104 is performed. Here, the basic flow of the thin film forming process S104 will be described and characterizing features of the present embodiment will be described later.

At the thin film forming step S104, the $TiCl_4$ gas is supplied from the gas supply structures 241a to 241c and the ammonia gas in the plasma state is supplied from the second gas supply structures 261a to 261c so that titanium nitride (TiN) films are formed on the wafers 200.

At the thin film forming step S104, the interior of the process chamber 201 is continuously exhausted by the exhaust unit even after the substrate loading and mounting process S102. In parallel with the evacuation, the $N_2$ gas as a purge gas is supplied from the gas supply structures 281a to 281f.

(Susceptor Rotation Start S202)

Next, details of the thin film forming step S104 will be described with reference to FIG. 10. First, when the wafers 200 are mounted on the respective wafer mounting members 221, the rotation of the susceptor 220 is started by the rotating mechanism 225. At this time, the rotation speed of the susceptor 220 is controlled by the controller 300. The rotation speed of the susceptor 220 may be, e.g., from 1 rpm to 100 rpm. Specifically, the rotation speed of the susceptor 220 may be, e.g., 60 rpm. As the susceptor 220 is rotated, the surface of the susceptor 220 and the wafers 200 begin to move at the lower side of the gas supply structures 241 and 261.

(Gas Supply Start S204)

If the wafers 200 are heated to reach a desired temperature and if the rotation speed of the susceptor 220 reaches a desired rotation speed, the supply of the $TiCl_4$ gas from the gas supply structures 241a to 241c is started. In parallel with the supply of the $TiCl_4$ gas, the ammonia gas in a plasma state is supplied from the second gas supply structures 261a to 261c.

At this time, the mass flow controller 245 is controlled to make the flow rate of the $TiCl_4$ gas become a predetermined flow rate. The supply flow rate of the $TiCl_4$ gas may be, e.g., 100 sccm to 5,000 sccm. A $N_2$ gas as a carrier gas may be supplied together with the $TiCl_4$ gas.

Furthermore, the mass flow controller 265 is controlled to make the flow rate of the ammonia gas become a predetermined flow rate. The supply flow rate of the ammonia gas may be, e.g., 100 sccm to 5,000 sccm. A $N_2$ gas as a carrier gas may be supplied together with the ammonia gas.

By appropriately adjusting the opening degree of the APC valve 294, the internal pressure of the process chamber 201 is set at a predetermined pressure.

From the gas supply start S204, a titanium-containing layer having a predetermined thickness begins to be formed on the surfaces of the wafers 200 and the surface of the susceptor 220.

(Film Forming Process (S206))

Then, the film forming process to be described below is performed by rotating the susceptor 220 a predetermined number of times. Here, the gases are exposed to the surfaces of the wafers 200 as well as the surface of the susceptor 220. Thus, while a desired film is formed on the wafers 200, a film is also formed on the surface of the susceptor 220.

Figure 11:
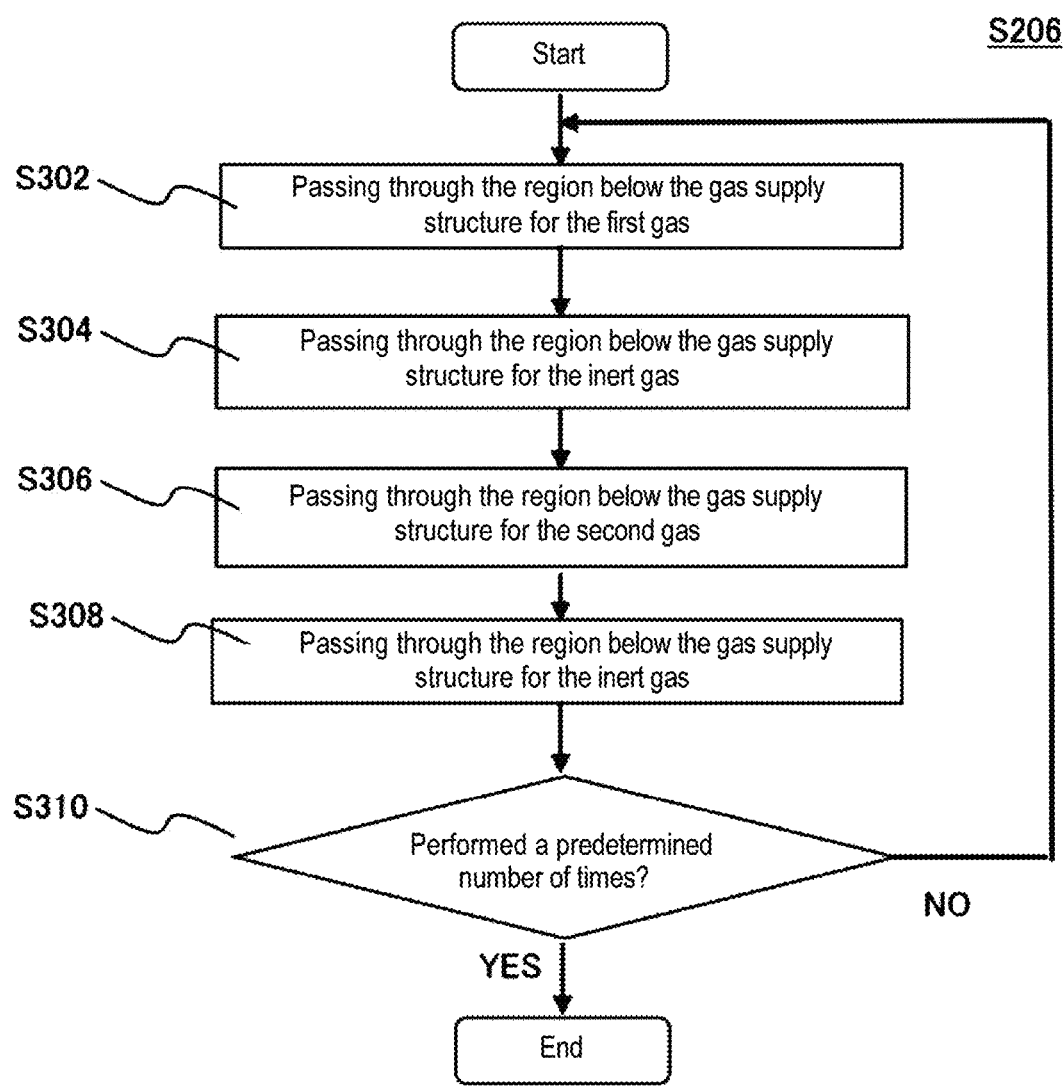
FIG. 11 is a flowchart explaining movement of wafers in the film forming process according to the first embodiment of the present disclosure.

Details of the film forming process S206 will now be described with reference to FIG. 11.

(Passing through a Region Below the First Gas Supply Structure (S302))

If the wafers 200 pass through a region below the first gas supply structure 241, a $TiCl_4$ gas is supplied to the wafers 200. As the $TiCl_4$ gas makes contact with the wafers 200, titanium-containing layers as the "first-element-containing layers" are formed on the surfaces of the wafers 200.

The titanium-containing layers are formed at a predetermined thickness and a predetermined distribution depending on, e.g., the internal pressure of the process chamber 201, the flow rate of the $TiCl_4$ gas, the temperature of the susceptor 220 and the time required for the wafers 200 to pass through the region below the first gas supply structure (the processing time in the region below the first gas supply structure).

(Passing through a Region below the Inert Gas Supply Structure (S304))

After passing through the region below the gas supply structure 241, the wafers 200 are moved along the rotation direction R of the susceptor 220 to a region below the inert gas supply structure. When the wafers 200 pass through the region below the inert gas supply structure, the titanium component failing to adhere to the wafers 200 in the region below the first gas supply structure is removed from above the wafers 200 by the inert gas.

(Passing through a Region Below the Second Gas Supply Structure (S306))

After passing through the region below the inert gas supply structure, the wafers 200 are moved along the rotation direction R of the susceptor 220 to a region below the second gas supply structure. When the wafers 200 pass through the region below the second gas supply structure, the titanium-containing layers react with the ammonia gas in the region below the second gas supply structure to form titanium nitride films.

(Passing through a Region below the Inert Gas Supply Structure (S308))

After passing through the region 201b below the second gas supply structure, the wafers 200 are moved along the rotation direction R of the susceptor 220 to a region below the inert gas supply structure. When the wafers 200 pass through the region below the inert gas supply structure, the nitrogen component failing to react with the titanium-containing layers of the wafers 200 in the region below the second gas supply structure is removed from above the wafers 200 by the inert gas.

(Determination S310)

In the meantime, the controller 300 determines whether one cycle described above has been performed a predetermined number of times. Specifically, the controller 300 counts the revolution number of the susceptor 220.

If it is determined that the cycle has not been performed the predetermined number of times (if "No" at S310), the susceptor 220 is allowed to further rotate, thereby repeating the cycle which includes passing through the region below the first gas supply structure at S302, passing through the region below the inert gas supply structure at S304, passing through the region below the second gas supply structure at S306 and passing through the region below the insert gas supply structure at S308. If it is determined that the cycle has been performed the predetermined number of times (if "Yes" at S310), the film forming process S206 is completed.

(Gas Supply Stop (S208))

After the film forming step (S206), at least the valve 246 is closed to stop the supply of the first-element-containing gas. Simultaneously, the valve 266 is closed to stop the supply of the second-element-containing gas.

(Susceptor Rotation Stop (S210))

After the gas supply stop (S208), the rotation of the susceptor 220 is stopped. Thus, the thin film forming process S104 is completed.

(Substrate Unloading Process (S106))

Then, the susceptor 220 is descended so that the wafers 200 are supported on the wafer lift pins 266 protruding from the surface of the susceptor 220. Thereafter, a certain gate valve is opened and the wafers 200 are unloaded out of the reaction container 203 using the first transfer robot 112. Then, if the substrate processing process is completed, the supply of the inert gas from the inert gas supply unit into the process chamber 201 is stopped.

(Cleaning Process (S110))

At the film forming process S104, the gases are exposed to not only the wafers 200 but also the susceptor 220. Therefore, a film is formed on the surface of the susceptor 220. Particularly, in the present embodiment, the tip of the gas supply hole and the surface of the susceptor 220 are brought into close proximity with each other in order to increase the exhaust amount of the gases. For that reason, a film is easily formed on the susceptor 220. Accordingly, a dense film is formed in the portion of the surface of the susceptor 220 just below the gas supply hole. In the portions of the surface of the susceptor 220 other than that just below the gas supply hole, for example, in the outer peripheral region of the gas supply hole or the inner peripheral region of the gas supply hole, the gases that are not exhausted are adhered to form a film having an uneven density. In view of this, the susceptor 220 needs to be periodically subjected to a cleaning process.

Figure 12:
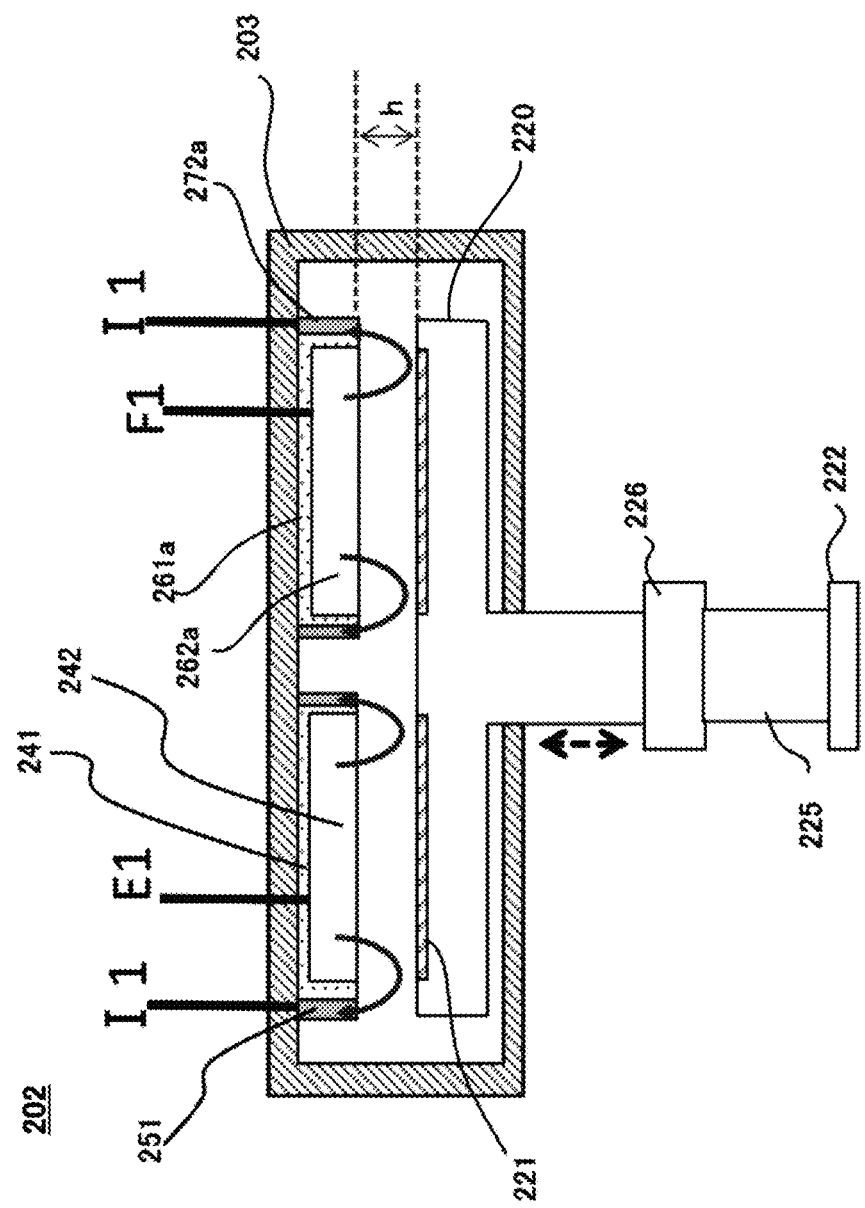
FIG. 12 is an explanatory view explaining a flow of a cleaning gas according to the first embodiment of the present disclosure.

A cleaning process according to the present embodiment will be described. After the wafers 200 are unloaded, as shown in FIG. 12, the susceptor 220, not having the wafers 200 thereon, is moved up to and maintained at a cleaning position. The cleaning position is set lower than the substrate processing position.

Specifically, the cleaning position is a position where the distance h between the susceptor surface and the lower ends of the convex members at the cleaning gas supply step becomes larger than the distance h at the film forming process. The controller 300 controls the susceptor 220 to move to the aforementioned position.

When the susceptor 220 is moved and maintained at the cleaning position, an inert gas is supplied from the gas supply holes 242 and 262. The supply amount of the inert gas at this stage may be smaller than the total amount of the various kinds of gases and the inert gas supplied at the film forming process. For example, the supply amount of the inert gas at this stage may be set to be an amount that can prevent the cleaning gas from flowing into the gas supply holes 242 and 262. By setting the supply amount of the inert gas in this manner, the cleaning gas can be prevented from flowing into the first gas supply hole 242, the second gas supply hole 262 and the inert gas supply hole 282, without suppressing diffusion of the cleaning gas. At least, during the time when the cleaning gas is supplied into the process chamber, the inert gas is continuously supplied. As a result, the respective gas supply holes and the interior of the gas supply pipes connected thereto are prevented from being etched by the cleaning gas.

In parallel with the supply of the inert gas, the exhaust unit is controlled so as to exhaust the atmosphere of the process chamber through the exhaust holes 251 and 272. At this time, the exhaust amount is set to be an amount that does not cause the majority of the cleaning gas to flow into the exhaust holes. For example, the exhaust flow rate during the cleaning process is controlled to become smaller than the exhaust flow rate at the film forming process.

If the supply of the inert gas from the respective gas supply structures is started, the susceptor 220 is rotated while opening the valve 336 to start the supply of the cleaning gas in a plasma state from the third gas supply hole 282. Unlike the substrate processing position, at the cleaning position, the distance between the susceptor surface and the gas supply holes is large so that the majority of the cleaning gas as supplied can reach the gas exhaust holes without making contact with the ceiling or the partitioning wall. That is, the cleaning gas reaches the susceptor surface without being deactivated. Since the cleaning gas of high energy is supplied onto the susceptor 220, it is possible to clean the surface of the susceptor 220 evenly.

Now, a comparative example of the first embodiment will be described. The comparative example is similar to the first embodiment, except that the cleaning gas in the comparative example is supplied at the substrate processing position.

After the susceptor 220 is moved up to and maintained at the substrate processing position, the cleaning gas in a plasma state is supplied from the gas supply hole 282. The distance h at the substrate processing position is set to be an amount not to allow the gases to be diffused within the process chamber, in order to increase the gas reaction efficiency and the gas use efficiency. Thus, the cleaning gas is in a hard-to-diffuse state. This poses the following problems.

First, since the distance between the gas supply holes and the susceptor is short and the atmosphere of the process chamber is kept at a high pressure, the cleaning gas is easily deactivated. Thus, the cleaning gas is deactivated at the positions spaced apart from the gas supply holes. The cleaning gas of high energy is supplied to the regions near the gas supply holes, while the deactivated cleaning gas is supplied to other regions. Accordingly, the energy of the cleaning gas becomes uneven. In this case, if the cleaning is performed for a long time, the susceptor is over-etched, while if the cleaning is performed for a short time, the cleaning is insufficient at some portions. The term "other regions" used herein may refer to, e.g., the spaces just below the exhaust holes, particularly just below the inner peripheral gas movement restraint portion and the outer peripheral gas movement restraint portion, and the spaces between the gas supply holes and the exhaust holes.

In contrast, in the present embodiment, the susceptor is maintained at the cleaning position. Thus, by reducing the pressure in the regions just below the gas supply holes, it is possible to secure the spaces where the gas is easily diffused. Accordingly, the energy of the cleaning gas can be made uniform in the processing space. This makes it possible to perform uniform cleaning.

In the present embodiment, the distance h, which is set to be larger at the cleaning position than that at the substrate processing position, is assumed as a distance between the surface of the susceptor 220 and the lower ends of the convex members. However, the present disclosure is not limited thereto. It is only required to secure a space for diffusing the cleaning gas with the movement of the susceptor. As an example, the distance between the ceiling and the susceptor may be assumed to be h. In this case, it is possible to maintain a constant distance even if the gas supply structures are deformed due to thermal sagging or the like. However, when the distance between the surface of the susceptor 220 and the lower ends of the convex members is assumed to be h, it is possible to reliably secure a space.

<Second Embodiment of the Present Disclosure>

Figure 13:
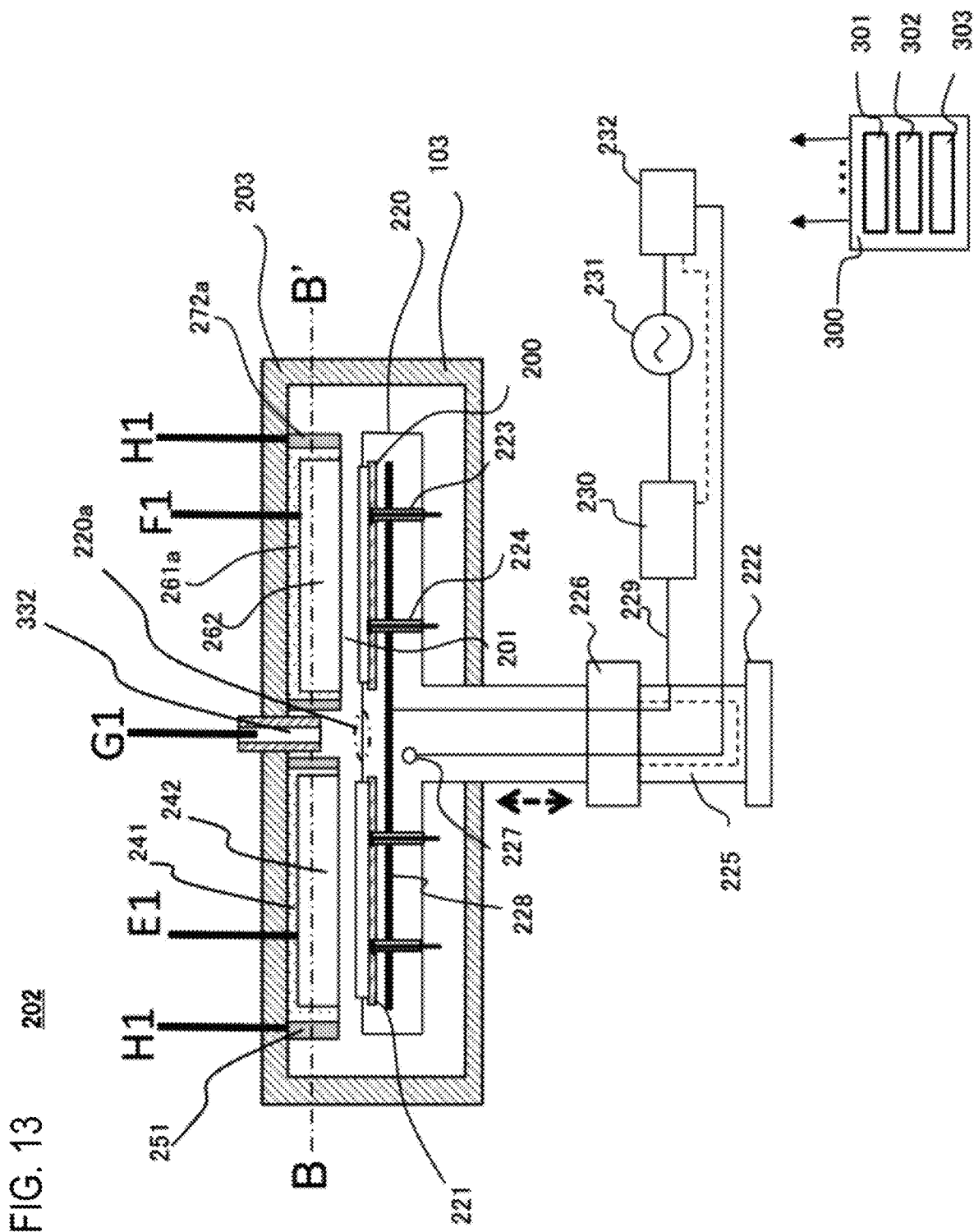
FIG. 13 is a vertical sectional schematic view of a process chamber employed in a substrate processing apparatus according to a second embodiment of the present disclosure.
Figure 14:
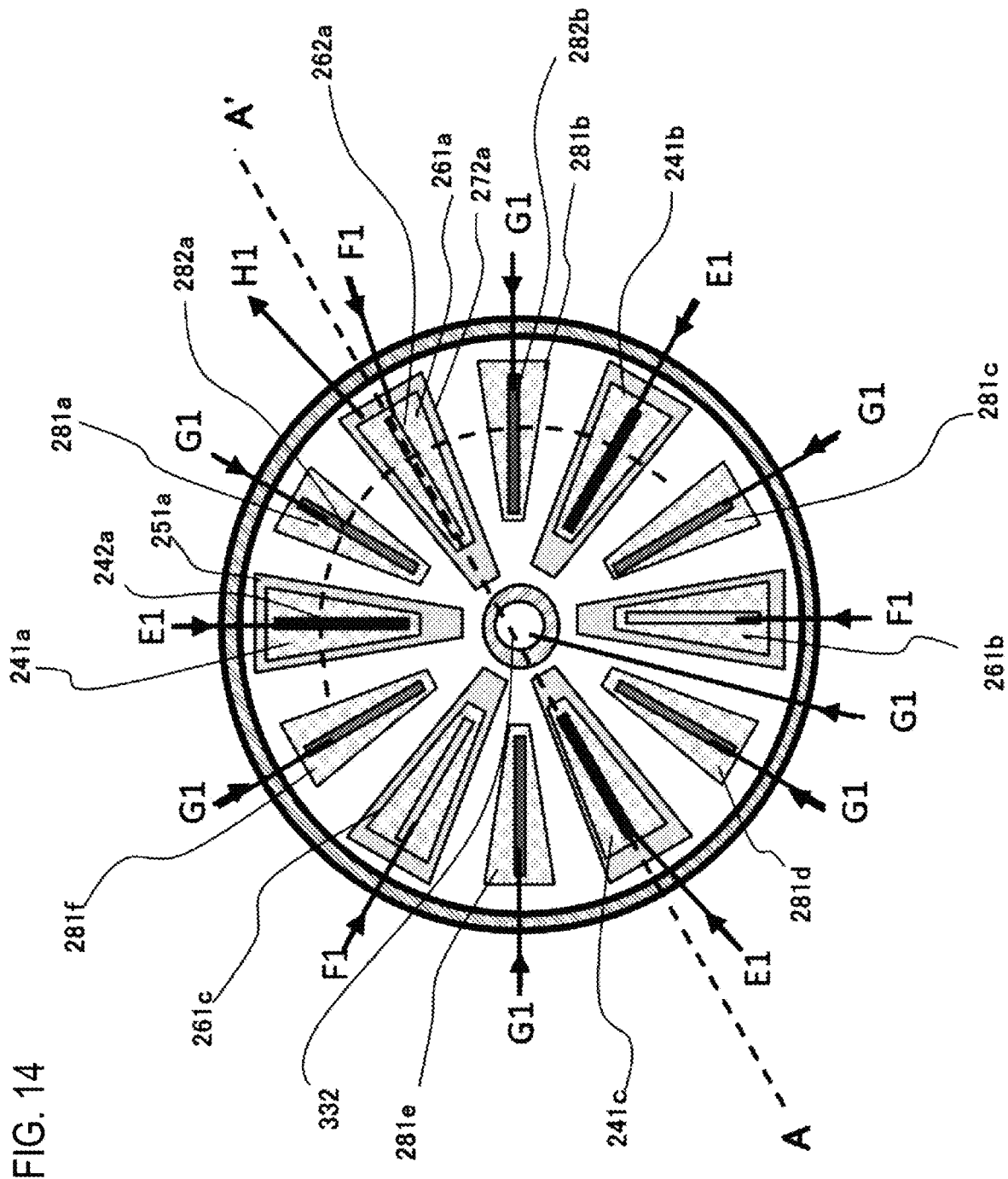
FIG. 14 is a horizontal sectional schematic view of the process chamber employed in the substrate processing apparatus according to the second embodiment of the present disclosure, which is taken along line B-B' in the process chamber shown in FIG. 13.

Next, a second embodiment will be described. The second embodiment differs from the first embodiment in terms of the cleaning gas supply hole and the cleaning process associated therewith. Hereinafter, the different features will be mainly described. FIGS. 13 and 14 are explanatory views explaining a process chamber according to the present embodiment. Components identical with those of the first embodiment will be designated by like reference numerals.

(Configuration of Process Chamber)

As shown in FIGS. 13 and 14, in case of the second embodiment, in addition to the components of the first embodiment, a cleaning gas supply hole 332 is formed in the upper central region of the process chamber. The cleaning gas supply hole 332 is connected to a cleaning gas supply pipe 333.

(Film Forming Process)

The susceptor 220 is maintained at the substrate processing position. Thereafter, just like the first embodiment, the gases are supplied into the process chamber, thereby forming films on the wafers 200.

(Cleaning Process)

Next, a cleaning step will be described. First, the susceptor 220 is maintained at the cleaning position. Just like the first embodiment, the supply of the inert gas from the gas supply holes 242 and 262 is started while the exhaust from the exhaust holes 251 272 is also started. Then, the cleaning gas supply unit is controlled such that the cleaning gas is supplied from the gas supply hole 282 and the gas supply hole 332.

Thus, even if material to be cleaned is deposited in a region of the further inner side of the inner peripheral gas movement restraint portion, namely in a central region 220a of the susceptor 220, it becomes possible to clean the central region 220a.

<Third Embodiment of the Present Disclosure>

Figure 15:
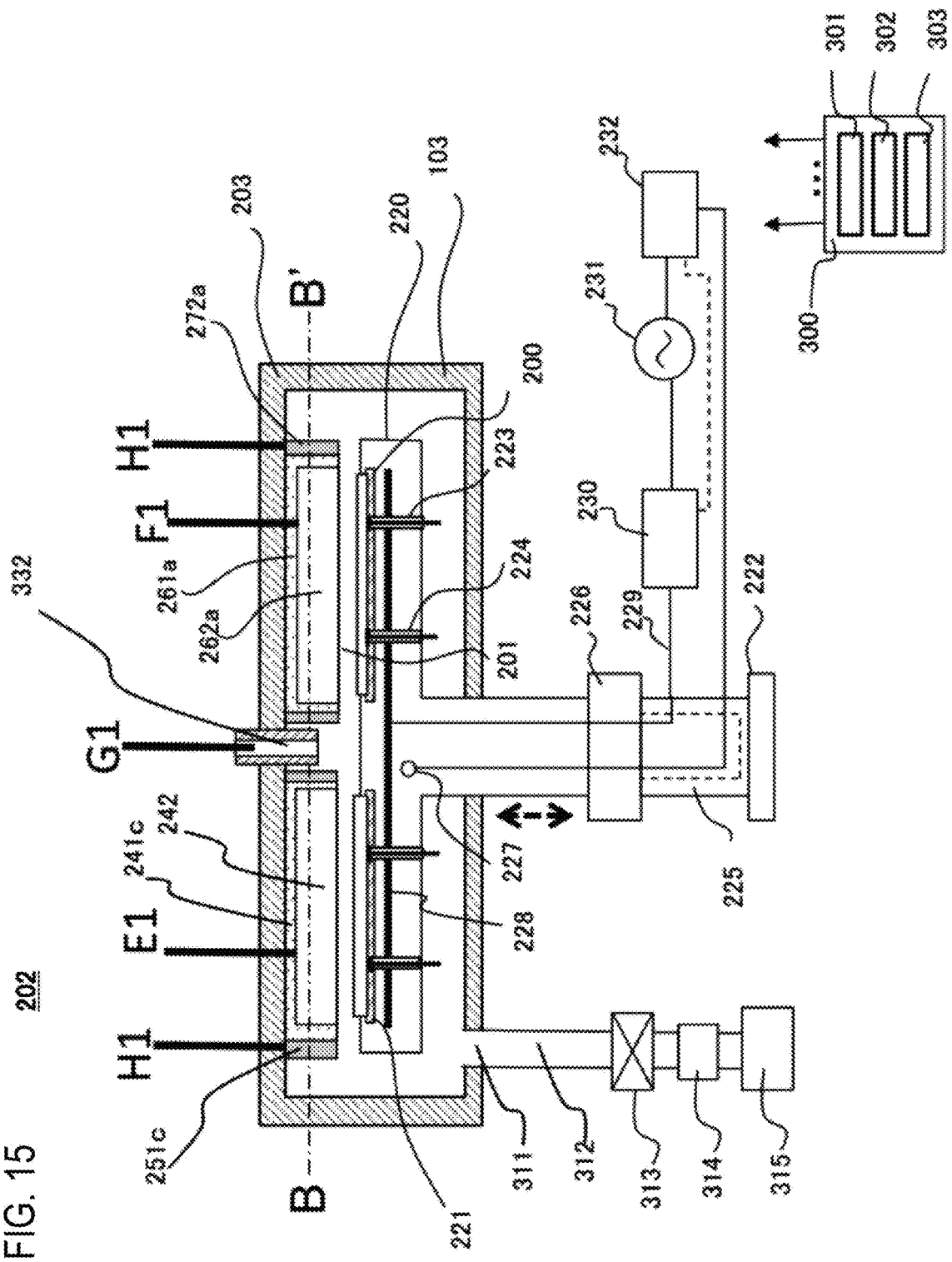
FIG. 15 is a vertical sectional schematic view of a process chamber employed in a substrate processing apparatus according to a third embodiment of the present disclosure.

Next, a third embodiment will be described. The third embodiment differs from the second embodiment in terms of the cleaning gas supply hole and the cleaning process associated therewith. Hereinafter, the different features will be mainly described. FIG. 15 is an explanatory views explaining a process chamber according to the present embodiment. Components identical with those of the second embodiment will be designated by like reference numerals.

(Configuration of Process Chamber)

As shown in FIG. 15, the third embodiment differs from the second embodiment in that a lower exhaust hole 311 is formed at the lower side of the susceptor 220. The lower exhaust hole 311 is configured by one end of an exhaust pipe 312. In the exhaust pipe 312, a shutoff valve 313, an APC (Automatic Pressure Controller) valve 314 as a pressure regulator (pressure regulating unit) and a pump 315 are disposed in this order from the upstream side.

(Film Forming Process)

The susceptor 220 is maintained at the substrate processing position. Thereafter, just like the first embodiment, gases are supplied into the process chamber, thereby forming films on the wafers 200. At the film forming process of the present embodiment, the valve 313 is closed in order to prevent the process gases from going around the side surface of the susceptor 220.

(Cleaning Process)

Next, a cleaning step will be described. First, the susceptor 220 is maintained at the cleaning position. Just like the second embodiment, the supply of the inert gas from the gas supply holes 242 and 262 is started. Moreover, the valve 293 installed at the downstream side of the exhaust hole 251 and the exhaust hole 272 is opened and the valve 313 of the exhaust pipe 312 disposed at the lower side of the process chamber is opened. Then, the cleaning gas supply unit is controlled such that the cleaning gas is supplied from the gas supply hole 282 and the gas supply hole 332.

During the exhaust, the exhaust conductance for the exhaust from the lower exhaust hole 311 is controlled to become larger than the exhaust conductance for the exhaust from the upper exhaust hole. By doing so, there are formed streams of the cleaning gas flowing from the gas supply hole 282 and the cleaning gas supply hole 332 toward the lower exhaust hole 311. Thus, even if the material to be cleaned is deposited in a region at the further outer side of the outer peripheral gas movement restraint portion, it becomes possible to clean the region using the gas streams.

<Fourth Embodiment of the Present Disclosure>

Next, a fourth embodiment will be described. The fourth embodiment remains the same as the third embodiment in terms of the apparatus form, but differs from the third embodiment in terms of the exhaust control at the cleaning process. Hereinafter, the different features will be mainly described.

(Configuration of Process Chamber)

Since the apparatus structure remains the same as that of the third embodiment, no description will be made on the configuration of the process chamber.

(Film Forming Step)

The susceptor 220 is maintained at the substrate processing position. Thereafter, just like the first embodiment, the gases are supplied into the process chamber, thereby forming films on the wafers 200. At the film forming process of the present embodiment, the valve 313 is closed in order to prevent the process gases from going around the side surface of the susceptor 220. Other processes are the same as those of the third embodiment and therefore will not be described.

(Cleaning Process)

Next, a cleaning process will be described. First, the susceptor 220 is maintained at the cleaning position. Just like the first embodiment, the supply of the inert gas from the gas supply hole 242 and the gas supply hole 262 is started. Moreover, the valve 293 installed at the downstream side of the exhaust hole 251 and the exhaust hole 272 is closed and the valve 313 of the exhaust pipe 312 disposed at the lower side of the process chamber is opened.

Then, the cleaning gas supply unit is controlled such that the cleaning gas is supplied from the gas supply hole 282 and the gas supply hole 332.

By closing the valve 293 and opening the valve 313, it is possible to reliably form streams of the cleaning gas flowing from the gas supply hole 282 and the gas supply hole 332 toward the lower exhaust hole 311. Thus, even if the material to be cleaned is deposited in a region at the further outer side of the outer peripheral gas movement restraint portion, it becomes possible to reliably clean the region.

<Fifth Embodiment of the Present Disclosure>

Next, a fifth embodiment will be described. The fifth embodiment differs from the third embodiment in terms of the cleaning gas supply unit. Moreover, the fifth embodiment differs from the third embodiment in terms of the control of the supply and the exhaust of the cleaning gas at the cleaning process. Hereinafter, the different features will be mainly described with reference to FIGS. 16, 17 and 18.

(Configuration of Process Chamber)

Figure 16:
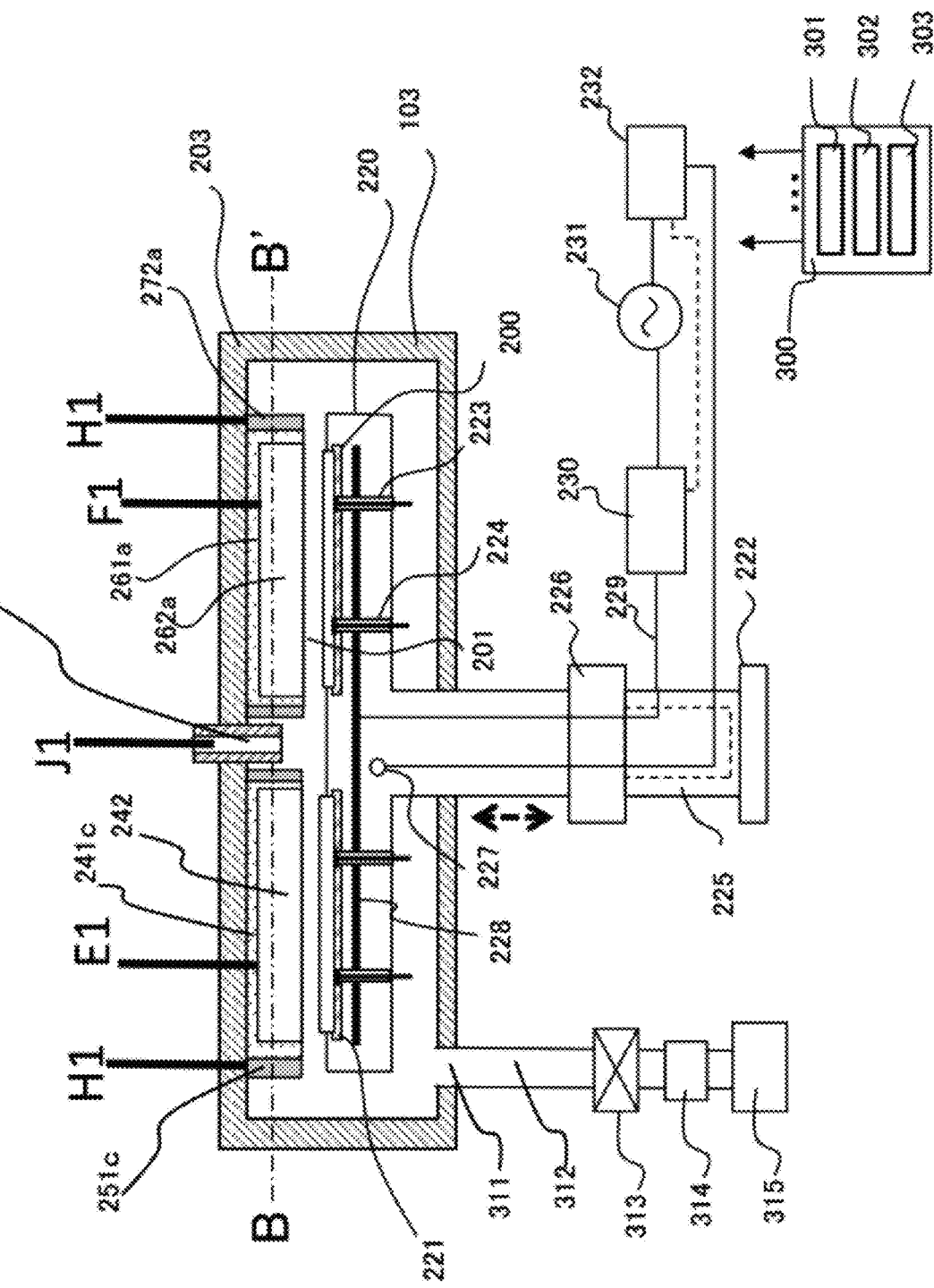
FIG. 16 is a vertical sectional schematic view of a process chamber employed in a substrate processing apparatus according to a fourth embodiment of the present disclosure.
Figure 17:
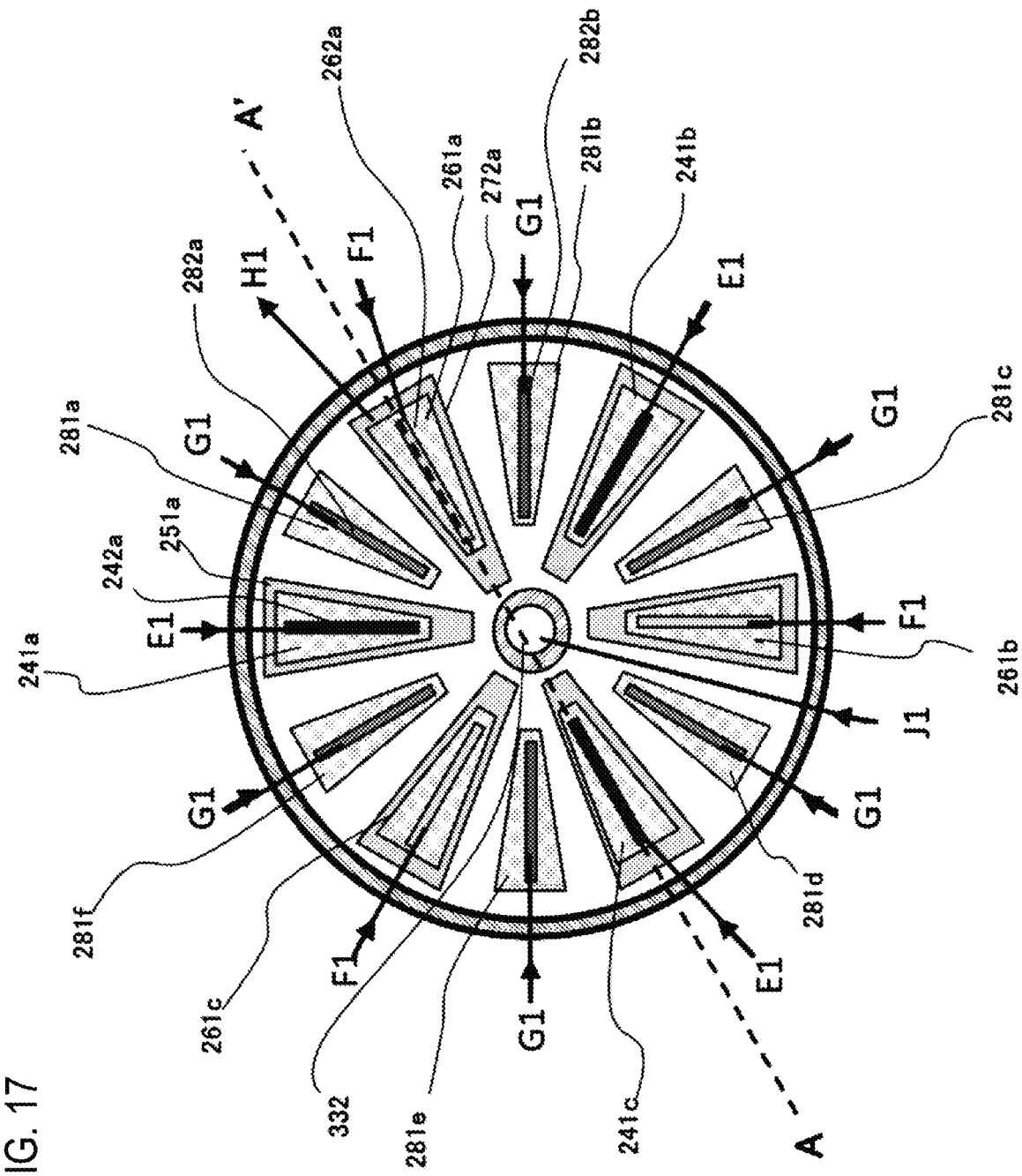
FIG. 17 is a horizontal sectional schematic view of the process chamber employed in the substrate processing apparatus according to the fourth embodiment of the present disclosure, which is taken along line B-B' in the process chamber shown in FIG. 16.
Figure 18A:
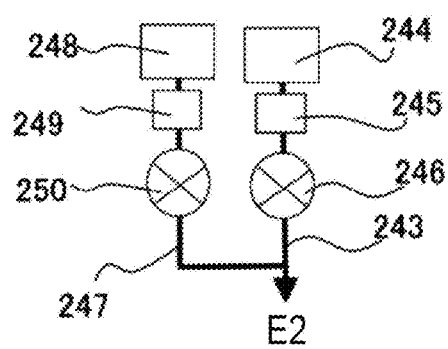
FIGS. 18A, 18B, 18C and 18D are explanatory views explaining gas supply units according to the fourth embodiment of the present disclosure.
Figure 18B:
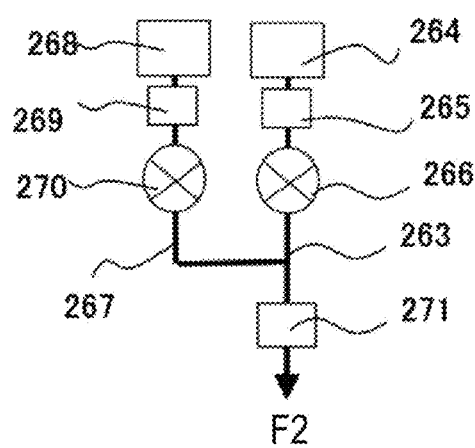
Figure 18C:
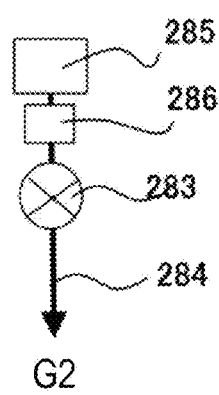
Figure 18D:
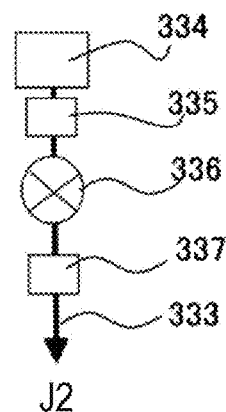

As shown in FIG. 16, in the fifth embodiment, a cleaning gas supply hole 332 is formed in the upper central region of the process chamber. The cleaning gas supply hole 332 is configured as one end of a cleaning gas supply pipe 333. In the cleaning gas supply pipe 333, a cleaning gas source 334, a mass flow controller 335, a valve 336 and a remote plasma unit 337 are installed in this order from the upstream side. While the cleaning gas supply pipe 333 is connected to the gas supply pipe 283 in the third embodiment, the cleaning gas supply pipe 333 in the present embodiment is not connected to the gas supply pipe 283. In other words, the cleaning gas supply pipe 333 is installed independently of the gas supply pipe 283.

(Film Forming Process)

The susceptor 220 is maintained at the substrate processing position. Thereafter, just like the first embodiment, the gases are supplied into the process chamber, thereby forming films on the wafers 200. At the film forming process of the present embodiment, the valve 313 is closed in order to prevent process gases from going around the side surface of the susceptor 220.

(Cleaning Process)

Next, a cleaning process will be described. First, the susceptor 220 is maintained at the cleaning position. Just like the first embodiment, the supply of the inert gas from the gas supply hole 242 and the gas supply hole 262 is started. Moreover, the valve 293 installed at the downstream side of the exhaust holes 251 and 272 is closed and the valve 313 of the exhaust pipe 312 disposed at the lower side of the process chamber is opened.

Then, the cleaning gas supply unit is controlled such that the cleaning gas is supplied from the cleaning gas supply hole 332.

By closing the valve 293 and opening the valve 313, it is possible to reliably form streams of the cleaning gas flowing from the gas supply hole 282 and the cleaning gas supply hole 332 toward the lower exhaust hole 311. Thus, even if material to be cleaned is deposited in a region at the further outer side of the outer peripheral gas movement restraint portion, it becomes possible to reliably clean the region.

By making the cleaning gas supply pipe 333 independent from the inert gas supply pipe 283 in this way, it becomes possible to use a cleaning gas of high energy. On the other hand, in case of the third embodiment, there is a possibility that the inner surface of the inert gas supply pipe 283 is etched by a cleaning gas of high energy.

As mentioned above, it becomes possible to use the cleaning gas of high energy. This makes it possible to shorten the cleaning time.

<Other Embodiments of the Present Disclosure>

While some embodiments of the present disclosure have been specifically described above, the present disclosure is not limited to the aforementioned respective embodiments but may be differently modified without departing from the spirit of the present disclosure.

For example, although the cleaning process has been described to be performed without wafers 200 therein, the cleaning process may be performed in a state where dummy substrates are mounted on the wafer mounting members 221. At the film forming process, films are not formed on the surfaces of the wafer mounting members 221 because the wafers 200 are mounted on the wafer mounting members 221. For that reason, if the cleaning gas is supplied without the wafers 200 on the wafer mounting members 221, there is a possibility that the wafer mounting members 221 are etched by the cleaning gas. Accordingly, by mounting the dummy substrates on the wafer mounting members 221, it is possible to prevent the wafer mounting members 221 from being etched.

In addition, for example, in the aforementioned respective embodiments, it has been described with the structure where the susceptor 220 is rotated to change the relative positions between the respective wafers 200 on the susceptor 220 and the gas supply structures. However, the present disclosure is not limited thereto. In other words, the present disclosure is not necessarily limited to the rotational drive type susceptor described in the respective embodiments as long as the relative positions between the respective wafers on the wafer mounting members 221 and the gas supply structures can be changed. As an alternative example, it may be possible to rotate the ceiling of the process chamber to which the gas supply structures are fixed.

For example, in the aforementioned respective embodiments, it has been described that in the film forming process performed by the substrate processing apparatus, a $TiCl_4$ gas as a precursor gas (first process gas) and a $NH_3$ gas as a reaction gas (second process gas) are alternately supplied to form the TiN films are formed on the wafers 200. However, the present disclosure is not limited thereto. The process gases used in the film forming process are not limited to the $TiCl_4$ gas and the $NH_3$ gas. Other kinds of thin films may be formed using other kinds of gases. The present disclosure can be applied to a case where three or more kinds of process gases are used, as long as a film forming process is performed by alternately supplying the process gases.

Moreover, for example, in the aforementioned respective embodiments, the film forming process has been taken as an example of the processes performed by the substrate processing apparatus. However, the present disclosure is not limited thereto. In addition to the film forming process, it may be possible to perform a process for forming an oxide film or a nitride film, or a process for forming a metal-containing film. Furthermore, specific contents of substrate processing processes do not matter. The present disclosure may be suitably applied to not only the film forming process but also other substrate processing processes such as an annealing process, an oxidizing process, a nitriding process, a diffusing process, a lithography process and the like. Moreover, the present disclosure may be suitably applied to other substrate processing apparatuses such as, e.g., an annealing apparatus, an oxidizing apparatus, a nitriding apparatus, an exposure apparatus, a coating apparatus, a drying apparatus, a heating apparatus or a processing apparatus using plasma. The present disclosure may use these apparatuses in combination. Some components of one embodiment may be replaced by the components of another embodiment. The components of one embodiment may be added with the components of another embodiment. In addition, some components of the respective embodiments may be added with other components, may be deleted or may be replaced by other components.

<Aspects of the Present Disclosure>

Hereinafter, the preferred aspects of the present disclosure will be additionally stated as supplementary notes.

[Supplementary Note 1]

A substrate processing apparatus, including:

a process chamber configured to process substrates;

a substrate mounting stand installed in the process chamber and configured to support the substrates along a circumferential direction;

a rotating unit configured to rotate the substrate mounting stand;

a first gas supply unit configured to supply a first gas from above the substrate mounting stand;

a second gas supply unit configured to supply a second gas from above the substrate mounting stand;

a third gas supply unit configured to supply a cleaning gas from above the substrate mounting stand; and an elevating unit configured to maintain the substrate mounting stand at a substrate processing position while supplying the first gas and the second gas and also configured to maintain the substrate mounting stand at a cleaning position while supplying the cleaning gas.

[Supplementary Note 2]

The apparatus of Supplementary Note 1, wherein in the substrate processing position, a distance between a surface of the substrate mounting stand and a convex member protruding from a ceiling of the process chamber is shorter than that in the cleaning position.

[Supplementary Note 3]

The apparatus of Supplementary Note 2, wherein the convex member is any of the first gas supply unit, the second gas supply unit and the third gas supply unit.

[Supplementary Note 4]

The apparatus of Supplementary Note 1, wherein in the substrate processing position, a distance between a surface of the substrate mounting stand and a ceiling of the process chamber is shorter than that in the cleaning position.

[Supplementary Note 5]

The apparatus of any one of Supplementary Notes 1 to 4, wherein the third gas supply unit is configured to supply an inert gas into the process chamber while the substrate mounting stand is maintained at the substrate processing position, and is configured to supply the cleaning gas into the process chamber while the substrate mounting stand is maintained at the cleaning position.

[Supplementary Note 6]

The apparatus of any one of Supplementary Notes 1 to 5, wherein an inert gas is supplied from one or both of the first gas supply unit and the second gas supply unit while supplying the cleaning gas from the third gas supply unit.

[Supplementary Note 7]

The apparatus of any one of Supplementary Notes 1 to 6, wherein the first gas supply unit is provided with a first gas supply hole, the second gas supply unit is provided with a second gas supply hole, the third gas supply unit is provided with a third gas supply hole, a plurality of combinations of the first gas supply hole and the second gas supply hole are disposed at an upper side of the process chamber along the circumferential direction, and the third gas supply holes are respectively disposed between the first gas supply holes and the second gas supply holes.

[Supplementary Note 8]

The apparatus of Supplementary Note 7, wherein, at the upper side of the process chamber, an upper exhaust hole is formed between the first gas supply hole and the second gas supply hole.

[Supplementary Note 9]

The apparatus of Supplementary Note 7, wherein, at the upper side of the process chamber, an upper exhaust hole is formed at a process chamber center side of the first gas supply hole.

[Supplementary Note 10]

The apparatus of Supplementary Note 7, wherein, at the upper side of the process chamber, an upper exhaust hole is formed at a process chamber center side of the second gas supply hole.

[Supplementary Note 11]

The apparatus of Supplementary Note 7, wherein, at the upper side of the process chamber, an upper exhaust hole is formed at a process chamber periphery side of the first gas supply hole.

[Supplementary Note 12]

The apparatus of Supplementary Note 7, wherein, at the upper side of the process chamber, an upper exhaust hole is formed at a process chamber periphery side of the second gas supply hole.

[Supplementary Note 13]

The apparatus of Supplementary Note 7, wherein, at the upper side of the process chamber, a first upper exhaust hole is formed in an outer periphery of the first gas supply hole and a second upper exhaust hole is formed in an outer periphery of the second gas supply hole.

[Supplementary Note 14]

The apparatus of any one of Supplementary Notes 1 to 13, wherein an exhaust unit having a lower exhaust hole is installed at a lower side of the substrate mounting stand.

[Supplementary Note 15]

The apparatus of Supplementary Note 14, wherein, while supplying the cleaning gas from the third gas supply unit, any combination or all of the first gas supply unit, the second gas supply unit, the third gas supply unit and the exhaust unit are controlled to allow a conductance of the lower exhaust hole to be larger than a conductance of the upper exhaust hole.

[Supplementary Note 16]

The apparatus of any one of Supplementary Notes 1 to 4, wherein the first gas supply unit is provided with a first gas supply hole, the second gas supply unit is provided with a second gas supply hole, the third gas supply unit is provided with a third gas supply hole, a plurality of combinations of the first gas supply hole and the second gas supply hole are disposed at an upper side of the process chamber along the circumferential direction, the third gas supply holes are respectively disposed between the first gas supply holes and the second gas supply holes, and a cleaning gas supply hole of a cleaning gas supply unit is disposed in an upper central region of the process chamber.

[Supplementary Note 17]

The apparatus of Supplementary Note 16, wherein the cleaning gas supply unit is configured to supply the cleaning gas into the process chamber while the substrate mounting stand is maintained at the cleaning position.

[Supplementary Note 18]

The apparatus of Supplementary Note 16 or 17, wherein, while supplying the cleaning gas from the cleaning gas supply unit, an inert gas is supplied from any one, combinations or all of the first gas supply unit, the second gas supply unit and the third gas supply unit.

[Supplementary Note 19]

The apparatus of any one of Supplementary Notes 16 to 18, wherein an exhaust unit having a lower exhaust hole is installed at a lower side of the substrate mounting stand.

[Supplementary Note 20]

The apparatus of Supplementary Note 19, wherein, while supplying the cleaning gas from the third gas supply unit, any combination or all of the first gas supply unit, the second gas supply unit, the third gas supply unit and the exhaust unit are controlled to allow a conductance of the lower exhaust hole to be larger than a conductance of the upper exhaust hole.

[Supplementary Note 21]

A semiconductor device manufacturing method, including:

a process in which substrates are loaded into a process chamber and are mounted on a substrate mounting stand accommodated within the process chamber along a circumferential direction;

a process in which the substrate mounting stand is maintained at a substrate processing position;

a process in which, while rotating the substrate mounting stand, a first gas and a second gas are supplied from above the substrate mounting stand by a first gas supply unit and a second gas supply unit to process the substrates mounted on the substrate mounting stand maintained at the substrate processing position;

a process in which the substrates are unloaded from the process chamber;

a process in which the substrate mounting stand is maintained at a cleaning position; and a process in which a cleaning gas is supplied from a third gas supply unit to clean the substrate mounting stand maintained at the cleaning position.

[Supplementary Note 22]

A program that causes a computer to execute:

a process in which substrates are loaded into a process chamber and are mounted on a substrate mounting stand accommodated within the process chamber along a circumferential direction;

a process in which the substrate mounting stand is maintained at a substrate processing position;

a process in which, while rotating the substrate mounting stand, a first gas and a second gas are supplied from above the substrate mounting stand by a first gas supply unit and a second gas supply unit to process the substrates mounted on the substrate mounting stand maintained at the substrate processing position;

a process in which the substrates are unloaded from the process chamber;

a process in which the substrate mounting stand is maintained at a cleaning position; and a process in which a cleaning gas is supplied from a third gas supply unit to clean the substrate mounting stand maintained at the cleaning position.

[Supplementary Note 23]

A non-transitory computer-readable recording medium storing a program that causes a computer to execute:

a process in which substrates are loaded into a process chamber and are mounted on a substrate mounting stand accommodated within the process chamber along a circumferential direction;

a process in which the substrate mounting stand is maintained at a substrate processing position;

a process in which, while rotating the substrate mounting stand, a first gas and a second gas are supplied from above the substrate mounting stand by a first gas supply unit and a second gas supply unit to process the substrates mounted on the substrate mounting stand maintained at the substrate processing position;

a process in which the substrates are unloaded from the process chamber;

a process in which the substrate mounting stand is maintained at a cleaning position; and a process in which a cleaning gas is supplied from a third gas supply unit to clean the substrate mounting stand maintained at the cleaning position.

According to the present disclosure in some embodiments, it is possible to provide a substrate processing apparatus, a semiconductor device manufacturing method and a program, which are capable of realizing an even and uniform cleaning.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method for manufacturing a semiconductor device, comprising:

loading a plurality of substrates into a process chamber and mounting the plurality of substrates on a substrate mounting stand, which is installed in the process chamber, along a circumferential direction;

maintaining the substrate mounting stand at a substrate processing position;

processing the plurality of substrates on the substrate mounting stand, which is maintained at the substrate processing position, by supplying a first gas and a second gas from a first gas supply unit and a second gas supply unit, respectively, arranged above the substrate mounting stand while rotating the substrate mounting stand;

unloading the plurality of substrates from the process chamber;

maintaining the substrate mounting stand at a cleaning position; and cleaning the substrate mounting stand, which is maintained at the cleaning position, by supplying a cleaning gas from a third gas supply unit arranged above the substrate mounting stand, wherein the cleaning position is lower than the substrate processing position.

2. The method of claim 1, wherein a distance between a surface of the substrate mounting stand at the substrate processing position and a convex member protruding from a ceiling of the process chamber is shorter than a distance between the surface of the substrate mounting stand at the cleaning position and the convex member protruding from the ceiling of the process chamber.

3. The method of claim 2, wherein the convex member is any of the first gas supply unit, the second gas supply unit, and the third gas supply unit.

4. The method of claim 1, wherein a distance between a surface of the substrate mounting stand at the substrate processing position and a ceiling of the process chamber is shorter than a distance between the surface of the substrate mounting stand at the cleaning position and the ceiling of the process chamber.

5. The method of claim 1, wherein the third gas supply unit is configured to supply an inert gas into the process chamber while the substrate mounting stand is maintained at the substrate processing position, and is further configured to supply the cleaning gas into the process chamber while the substrate mounting stand is maintained at the cleaning position.

6. The method of claim 2, wherein the third gas supply unit is configured to supply an inert gas into the process chamber while the substrate mounting stand is maintained at the substrate processing position, and is further configured to supply the cleaning gas into the process chamber while the substrate mounting stand is maintained at the cleaning position.

7. The method of claim 3, wherein the third gas supply unit is configured to supply an inert gas into the process chamber while the substrate mounting stand is maintained at the substrate processing position, and is further configured to supply the cleaning gas into the process chamber while the substrate mounting stand is maintained at the cleaning position.

8. The method of claim 4, wherein the third gas supply unit is configured to supply an inert gas into the process chamber while the substrate mounting stand is maintained at the substrate processing position, and is further configured to supply the cleaning gas into the process chamber while the substrate mounting stand is maintained at the cleaning position.

9. The method of claim 1, wherein an inert gas is supplied from one or both of the first gas supply unit and the second gas supply unit while the cleaning gas is supplied from the third gas supply unit.

10. The method of claim 2, wherein an inert gas is supplied from one or both of the first gas supply unit and the second gas supply unit while the cleaning gas is supplied from the third gas supply unit.

11. The method of claim 3, wherein an inert gas is supplied from one or both of the first gas supply unit and the second gas supply unit while the cleaning gas is supplied from the third gas supply unit.

12. The method of claim 4, wherein an inert gas is supplied from one or both of the first gas supply unit and the second gas supply unit while the cleaning gas is supplied from the third gas supply unit.

13. The method of claim 5, wherein the inert gas is supplied from one or both of the first gas supply unit and the second gas supply unit while the cleaning gas is supplied from the third gas supply unit.

\* \* \* \* \*